US010062593B2

(12) United States Patent
Kuwahara

(10) Patent No.: US 10,062,593 B2
(45) Date of Patent: Aug. 28, 2018

(54) SUBSTRATE PROCESSING APPARATUS AND SUBSTRATE PROCESSING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/753,063

(22) Filed: Jun. 29, 2015

(65) Prior Publication Data
US 2016/0020125 A1    Jan. 21, 2016

(30) Foreign Application Priority Data

Jul. 18, 2014    (JP) .................................. 2014-147276

(51) Int. Cl.
*G06F 7/00* (2006.01)
*G06F 19/00* (2011.01)
(Continued)

(52) U.S. Cl.
CPC .. *H01L 21/67742* (2013.01); *H01L 21/67028* (2013.01); *H01L 21/67253* (2013.01); *H01L 21/67778* (2013.01); *H01L 21/681* (2013.01); *H01L 21/6838* (2013.01); *H01L 21/68728* (2013.01)

(58) Field of Classification Search
None
See application file for complete search history.

(56) References Cited

U.S. PATENT DOCUMENTS 6,934,606 B1 * 8/2005 Genetti ............. H01L 21/67201
118/712
2002/0134179 A1   9/2002 Maruyama et al. ......... 73/865.8
(Continued)

FOREIGN PATENT DOCUMENTS

JP    11-163083    6/1999
JP    11-163084    6/1999
(Continued)

OTHER PUBLICATIONS

Notice of Reasons for Refusal dated Apr. 10, 2018 in counterpart Japanese Patent Application No. 2014-147276.

*Primary Examiner* — Yolanda R Cumbess
(74) *Attorney, Agent, or Firm* — Ostrolenk Faber LLP

(57) ABSTRACT

During a teaching operation regarding a transport mechanism, a hand of the transport mechanism is moved to a tentative target position in a substrate supporter, and a substrate supported at a reference position in the substrate supporter is received by the hand. A positional relationship between the substrate held by the hand and the hand is detected. A deviation between the tentative target position and the reference position is acquired as correction information based on the detected positional relationship. During the teaching operation or during substrate processing, the tentative target position is corrected to a true target position to coincide with the reference position based on the acquired correction information. During the substrate processing, the hand is moved to the true target position, so that the substrate is transferred to the substrate supporter by the hand, or the substrate is received from the substrate supporter by the hand.

11 Claims, 24 Drawing Sheets

(51) Int. Cl.
*H01L 21/677* (2006.01)
*H01L 21/67* (2006.01)
*H01L 21/68* (2006.01)
*H01L 21/683* (2006.01)
*H01L 21/687* (2006.01)

(56) References Cited

U.S. PATENT DOCUMENTS

| | | | | |
|---|---|---|---|---|
| 2003/0231950 | A1* | 12/2003 | Raaijmakers | H01L 21/681 414/800 |
| 2004/0151574 | A1* | 8/2004 | Lu | H01L 21/681 414/816 |
| 2009/0088887 | A1* | 4/2009 | Chen | H01L 21/68 700/114 |
| 2012/0224945 | A1 | 9/2012 | Douki et al. | 414/758 |
| 2012/0257176 | A1* | 10/2012 | Hayashi | H01L 21/67259 355/27 |
| 2013/0202388 | A1* | 8/2013 | Hayashi | H01L 21/677 414/222.02 |
| 2014/0023776 | A1 | 1/2014 | Kuwahara et al. | 427/8 |
| 2014/0234991 | A1 | 8/2014 | Douki et al. | 438/5 |
| 2014/0340509 | A1* | 11/2014 | Fairbairn | H04N 7/18 348/95 |

FOREIGN PATENT DOCUMENTS

| | | |
|---|---|---|
| JP | 11-163098 | 6/1999 |
| JP | 11163083 A * | 6/1999 |
| JP | 11163084 A * | 6/1999 |
| JP | 11163084 A * | 6/1999 |
| JP | 2006-165586 A | 6/2006 |
| JP | 2012-079909 A | 4/2012 |
| JP | 2012-182393 | 9/2012 |
| JP | 2012-222238 | 11/2012 |
| JP | 2013-162029 A | 8/2013 |
| JP | 2014-022589 | 2/2014 |
| WO | WO 02/21589 A1 | 3/2002 |

* cited by examiner

F I G. 7
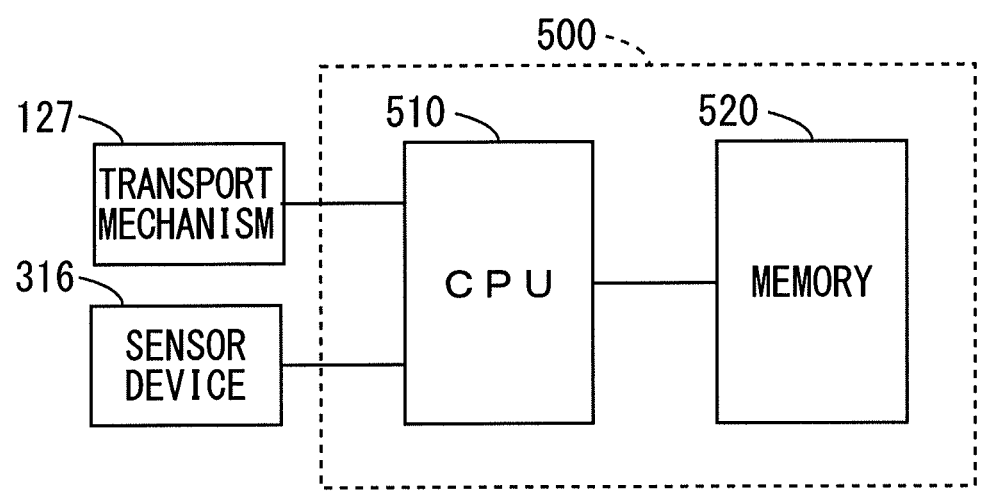

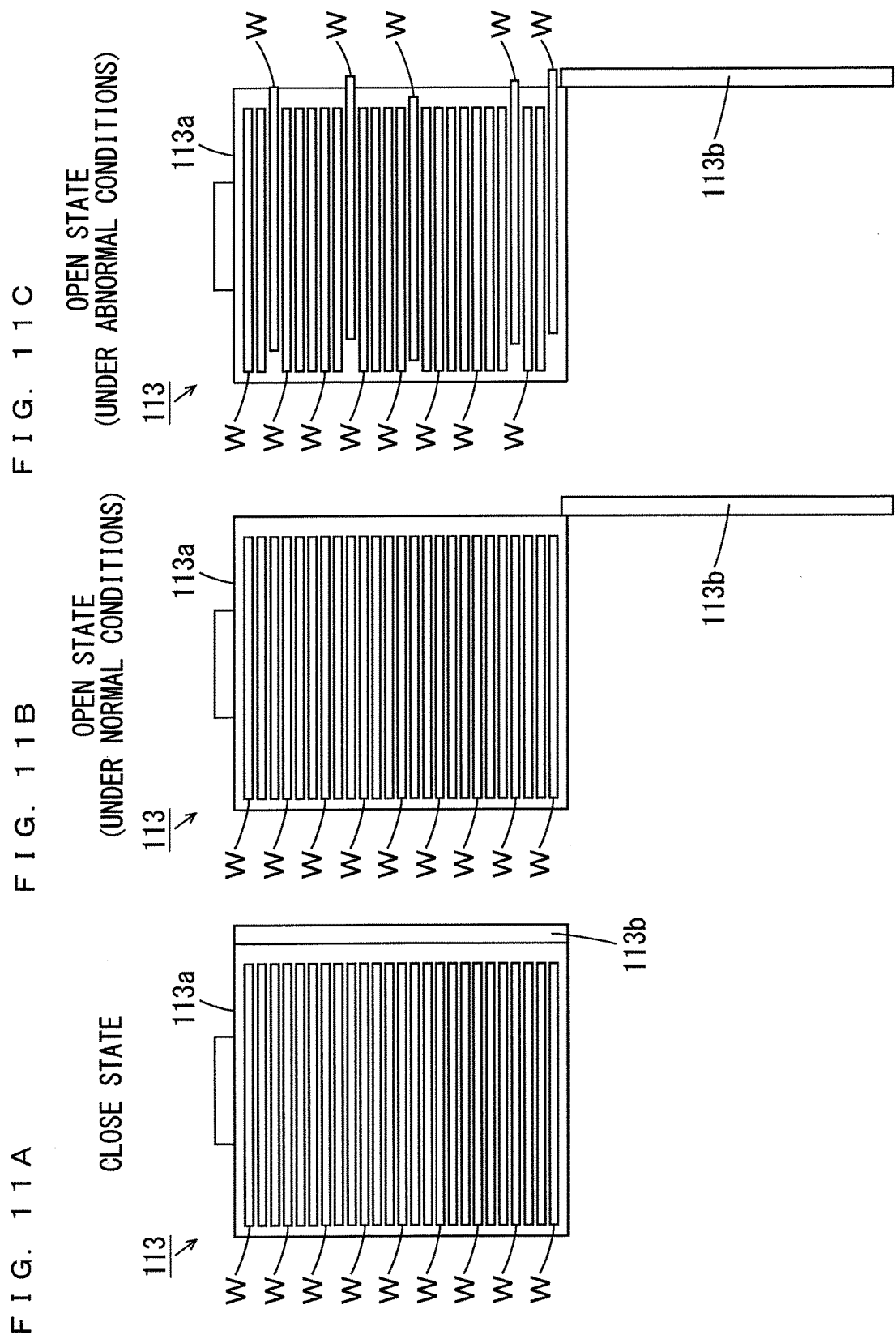

SUBSTRATE PROCESSING APPARATUS AND SUBSTRATE PROCESSING METHOD

BACKGROUND OF THE INVENTION

Field of the Invention

The present invention relates to a substrate processing apparatus and a substrate processing method.

Description of Related Art

Substrate processing apparatuses are used to subject various types of substrates such as semiconductor substrates, substrates for liquid crystal displays, plasma displays, optical disks, magnetic disks, magneto-optical disks, photomasks, or other substrates to various types of processing. In such a substrate processing apparatus, a plurality of substrates are sequentially transported by a transport device to a predetermined substrate supporter in a processing section. The processing section performs predetermined processing on the substrate transported to the substrate supporter. It is desired that the substrate is placed on the substrate supporter with a center of the substrate accurately coinciding with a desired position in the substrate supporter in order to improve accuracy of processing for the substrate. Teaching regarding the transport device is performed during installment or maintenance of the substrate processing apparatus, whereby a deviation between a position of the substrate supporter at which the substrate is to be supported and a position at which the substrate is actually supported is corrected.

In a substrate processing apparatus described in JP 11-163083 A, a jig including an optical sensor is held by an arm of a transport device during teaching. Three pins are formed at a substrate supporter. The jig held by the arm is brought closer to the three pins until the jig and the pins have a predetermined relative positional relationship. In this state, the arm is moved in a plurality of predetermined directions, so that positions of two pins of the three pins are detected as positional information by the optical sensor of the jig. The position of the substrate supporter to which the arm accesses is set based on the detected positional information.

BRIEF SUMMARY OF THE INVENTION

As described in JP 11-163083 A, the dedicated jig is used for the teaching, so that a burden on an operator caused by the teaching is reduced. However, a burden on the operator due to maintenance and management of the jig is increased. Further, a cost for purchase of the jig is increased, and a cost resulting from the maintenance and management of the jig is increased.

An object of the present invention is to provide a substrate processing apparatus and a substrate processing method capable of performing teaching regarding a transport device at a low cost while a burden on an operator is reduced.

(1) A substrate processing apparatus according to one aspect of the present invention that performs processing on a substrate includes a substrate supporter that has a preset reference position and is configured to be capable of supporting the substrate, a first transport device that has a first holder configured to hold the substrate and transports the substrate by moving the first holder, a position detector that detects a positional relationship between the substrate held by the first holder and the first holder, and a controller that controls the first transport device to move the first holder and transfer the substrate to the substrate supporter or controls the first transport device to move the first holder and receive the substrate from the substrate supporter, wherein the controller controls the first transport device to move the first holder to a target position in the substrate supporter and receive the substrate supported at the reference position in the substrate supporter, acquires a deviation between the target position and the reference position as correction information based on the positional relationship detected by the position detector, during a teaching operation regarding the first transport device, corrects the target position based on the acquired correction information such that the target position coincides with the reference position, during the teaching operation or during substrate processing, and controls the first transport device such that the first holder is moved to the corrected target position, during the substrate processing.

In this substrate processing apparatus, during the teaching operation regarding the first transport device, the first holder of the first transport device is moved to the target position in the substrate supporter, and the substrate supported at the reference position in the substrate supporter is received by the first holder. The positional relationship between the substrate held by the first holder and the first holder is detected. The deviation between the target position and the reference position is acquired as the correction information based on the detected positional relationship.

During the teaching operation or during the substrate processing, the target position is corrected based on the acquired correction information to coincide with the reference position. During the substrate processing, the first holder is moved to the corrected target position, so that the substrate is transferred to the substrate supporter by the first holder or the substrate is received from the substrate supporter by the first holder. Thus, the substrate can be transferred to the substrate supporter by the first holder to be supported at the reference position, or the first holder can be moved to the substrate supporter to receive the substrate supported at the reference position.

This configuration causes the first holder of the first transport device to receive the substrate supported at the reference position by the substrate supporter, so that the teaching operation regarding the first transport device is performed. Thus, a burden on an operator due to the teaching regarding the first transport device is reduced. In this case, it is not necessary to prepare the dedicated jig in order to perform the teaching regarding the first transport device. Therefore, a burden on the operator due to the maintenance and management of the jig does not occur, and a cost resulting from the purchase of the jig, and maintenance and management of the jig does not occur either. As a result, the teaching regarding the first transport device can be performed at a low cost while a burden on the operator is reduced.

(2) The substrate supporter may include a guide mechanism that leads the substrate to the reference position, and the substrate may be led to the reference position in the substrate supporter by the guide mechanism during the teaching operation.

In this case, the substrate is led to the reference position by the guide mechanism. Thus, during the teaching operation, it is not necessary for the operator to perform an operation for positioning the substrate at the reference position. Therefore, a burden on the operator is more sufficiently reduced. Further, also during the substrate processing, the substrate is accurately positioned at the reference position in the substrate supporter by the guide mechanism.

(3) The substrate processing apparatus may further include a storage container that stores the substrate, wherein the storing container may include the substrate supporter and may be configured to store the substrate at the reference position by the guide mechanism, the target position may be set in the storing container, and the controller may control the first transport device to move the first holder to the target position in the storing container and receive the substrate stored at the reference position in the storing container, during the teaching operation.

In this case, the substrate is stored at the reference position in the storage container by the guide mechanism. Thus, during the teaching operation, it is not necessary for the operator to perform the operation for positioning the substrate at the reference position. Therefore, a burden on the operator is more sufficiently reduced.

(4) The substrate processing apparatus may further include a processing unit that performs processing on the substrate, wherein the processing unit may include the substrate supporter, the target position may be set in the processing unit, and the controller may control the first transport device to move the first holder to the target position in the processing unit and receive the substrate supported at the reference position by the guide mechanism in the processing unit, during the teaching operation.

In this case, the substrate is supported at the reference position by the guide mechanism in the processing unit. Further, it is not necessary for the operator to perform the operation for positioning the substrate at the reference position. Therefore, a burden on the operator is more sufficiently reduced.

(5) The substrate processing apparatus may further include a substrate platform, including the substrate supporter, on which the substrate is temporarily placed, and a second transport device that has a second holder configured to hold the substrate and transports the substrate by moving the second holder, wherein the target position may be set on the substrate platform, and the controller may control the second transport device to move the second holder to the substrate supporter of the substrate platform and place the substrate on the substrate supporter, may consider a position of the substrate placed on the substrate supporter as the reference position, and may control the first transport device to move the first holder to the target position on the substrate platform and receive the substrate placed on the substrate supporter, during the teaching operation.

In this case, the substrate is received and transferred between the first holder of the first transport device and the second holder of the second transport device via the substrate platform. The position of the substrate placed on the substrate platform by the second holder is considered as the reference position. Thus, it is not necessary for the operator to perform the operation for positioning the substrate at the reference position. Therefore, a burden on the operator is more sufficiently reduced.

(6) The substrate processing apparatus may further include a second transport device that has a second holder configured to hold the substrate as the substrate supporter and transports the substrate by moving the second holder, wherein the target position may be set in the second holder at a time of receiving and transferring of the substrate between the first transport device and the second transport device, the controller may consider a position of the substrate held by the second holder as the reference position, and may control the first transport device to move the first holder to the target position in the second holder and receive the substrate from the second holder, during the teaching operation.

In this case, the substrate is received and transferred between the first holder of the first transport device and the second holder of the second transport device. The position of the substrate held by the second holder is considered as the reference position. Thus, it is not necessary for the operator to perform the operation for positioning the substrate at the reference position. Therefore, a burden on the operator is more sufficiently reduced.

(7) A substrate processing apparatus according to another aspect of the present invention that performs processing on a substrate includes a substrate supporter that has a preset reference position and is configured to hold the substrate in a horizontal attitude and be rotatable about the reference position, a first transport device that has a first holder configured to hold the substrate and transports the substrate by moving the first holder, a position detector that detects a positional relationship between the substrate held by the first holder and the first holder, and a controller that controls the first transport device to move the first holder and transfer the substrate to the substrate supporter or controls the first transport device to move the first holder and receive the substrate from the substrate supporter, wherein the controller controls the first transport device to move the first holder to a target position in the substrate supporter and transfer the substrate to the substrate supporter, controls the substrate supporter such that the substrate supported by the substrate supporter is rotated by a predetermined angle, controls the first transport device to move the first holder to the target position in the substrate supporter and receive the substrate supported by the substrate supporter, acquires a deviation between the target position and the reference position as correction information based on a positional relationship between the first holder and the substrate detected by the position detector before the substrate is transferred to the substrate supporter and the positional relationship between the first holder and the substrate detected by the position detector after the substrate is received from the substrate supporter, during a teaching operation regarding the first transport device, corrects the target position to coincide with the reference position based on the acquired correction information, during the teaching operation or during substrate processing, and controls the first transport device to move the first holder to the corrected target position during the substrate processing.

In this substrate processing apparatus, during the teaching operation regarding the first transport device, the positional relationship between the substrate held by the first holder of the first transport device and the first holder is detected. The first holder of the first transport device is moved to the target position in the substrate supporter, and the substrate is transferred to the substrate supporter. The substrate supported by the substrate supporter in a horizontal attitude is rotated about the reference position by a predetermined angle. The first holder is moved to the target position in the substrate supporter, and the substrate supported by the substrate supporter is received and held by the first holder. Thereafter, the positional relationship between the substrate held by the first holder and the first holder is detected. The deviation between the target position and the reference position is acquired as the correction information based on the positional relationship between the first holder and the substrate before the substrate is transferred to the substrate supporter and the positional relationship between the first holder and the substrate after the substrate is received from the substrate supporter.

During the teaching operation or during the substrate processing, the target position is corrected to coincide with the reference position based on the acquired correction information. During the substrate processing, the first holder is moved to the corrected target position, so that the substrate is transferred to the substrate supporter by the first holder, or the substrate is received from the substrate supporter by the first holder. Thus, the substrate can be transferred to the substrate supporter by the first holder to be supported at the reference position, or the first holder can be moved to the substrate supporter to receive the substrate supported at the reference position.

This configuration causes the first holder of the first transport device to transfer the substrate to the substrate supporter and receive the rotated substrate, so that the teaching operation regarding the first transport device is performed. Thus, a burden on the operator due to the teaching regarding the first transport device is reduced. In this case, it is not necessary to prepare the dedicated jig in order to perform the teaching regarding the first transport device. Therefore, a burden on the operator due to the maintenance and management of the jig does not occur, and a cost resulting from the purchase of the jig, and the maintenance and management of the jig does not occur either. As a result, the teaching regarding the first transport device can be performed at a low cost while a burden on the operator is reduced.

(8) The predetermined angle may be 180 degrees. In this case, the correction information can be easily acquired based on the positional relationship between the first holder and the substrate before the substrate is transferred to the substrate supporter and the positional relationship between the first holder and the substrate after the substrate is received from the substrate supporter.

(9) The substrate processing apparatus may further include a holding detector detecting that the first holder has held a lower surface of the substrate, wherein the controller may control the first transport device to lift the first holder from below the substrate supported at a reference height by the substrate supporter, may determine a target height in a vertical direction based on a position of the first holder in the vertical direction at a detection time point by the holding detector, during the teaching operation, and may control the first transport device to move the first holder to the determined target height when the first holder is moved to the substrate supporter during the substrate processing.

In this case, the first holder of the first transport device receives the substrate supported by the substrate supporter, so that the teaching operation in the vertical direction regarding the first transport device is performed. Thus, a burden on the operator due to the teaching in the vertical direction regarding the first transport device is reduced. Therefore, it is not necessary to prepare the dedicated jig in order to perform the teaching operation regarding the first transport device. Therefore, a burden on the operator due to the maintenance and management of the jig does not occur, and a cost resulting from the purchase of the jig, and the maintenance and management of the jig does not occur either. As a result, the teaching in the vertical direction regarding the first transport device can be performed at a low cost while a burden on the operator is reduced.

(10) The first transport device may have the plurality of first holders, and the controller may control the first transport device such that the substrate is transported between one first holder and another first holder via the substrate supporter, may acquire a deviation between a target position corresponding to the other first holder and the reference position as correction information corresponding to the other first holder based on a positional relationship between the one first holder and the substrate, a positional relationship between the other first holder and the substrate and correction information corresponding to the one first holder, during the teaching operation, may correct the target position corresponding to the other first holder based on the acquired correction information corresponding to the other first holder such that the target position corresponding to the other first holder coincides with the reference position, during the teaching operation or during the substrate processing, and may control the first transport device to move the other first holder to the corrected target position corresponding to the other first holder during the substrate processing.

In this case, the correction information corresponding to the other first holder can be easily acquired based on the correction information corresponding to the one first holder of the first transport device.

(11) A substrate processing apparatus according to yet another aspect of the present invention that performs processing on a substrate includes a substrate supporter configured to be capable of supporting the substrate, a transport device that has a holder configured to hold the substrate and transports the substrate by moving the holder, a holding detector detecting that the holder has held a lower surface of the substrate, and a controller that controls the transport device to move the holder and transfer the substrate to the substrate supporter or controls the transport device to move the holder and receive the substrate from the substrate supporter, wherein the controller controls the transport device to lift the holder from below the substrate supported by the substrate supporter at a reference height, determines a target height in a vertical direction based on a position of the holder in the vertical direction at a detection time point by the holding detector, during a teaching operation regarding the transport device, and controls the transport device to move the holder to the determined target height when the holder is moved to the substrate supporter during substrate processing.

In this substrate processing apparatus, during the teaching operation regarding the transport device, the holder of the transport device is lifted from below the substrate supported at the reference height by the substrate supporter. It is detected that the holder has held the lower surface of the substrate. The target height in the vertical direction is determined based on the position of the holder in the vertical direction at the detection time point. When the holder is moved to the substrate supporter during the substrate processing, the holder is moved to the determined target height, so that the substrate is transferred to the substrate supporter, or the substrate is received from the substrate supporter. Thus, the substrate can be transferred to the substrate supporter by the holder to be supported at the reference height, or the holder can be moved to the substrate supporter to receive the substrate supported at the reference height.

This configuration causes the holder of the transport device to receive the substrate supported by the substrate supporter, so that the teaching operation in the vertical direction regarding the transport device is performed. Thus, a burden on the operator due to the teaching in the vertical direction regarding the transport device is reduced. In this case, it is not necessary to prepare the dedicated jig in order to perform the teaching operation regarding the transport device. Therefore, a burden on the operator due to the maintenance and management of the jig does not occur, and a cost resulting from the purchase of the jig, and the maintenance and management of the jig does not occur either. As a result, the teaching in the vertical direction regarding the transport device can be performed at a low cost while a burden on the operator is reduced.

(12) The holder may include a suction portion that sucks a lower surface of the substrate, and the holding detector may be configured to detect based on whether the substrate is sucked by the suction portion that the holder has held the lower surface of the substrate.

In this case, it can be detected with an easy configuration that the holder has held the lower surface of the substrate. Further, the holder can reliably hold the substrate.

(13) A substrate processing method according to yet another aspect of the present invention for performing processing on a substrate, including the steps of moving a first holder of a first transport device to a target position in a substrate supporter and receiving the substrate supported at a reference position in the substrate supporter, during a teaching operation regarding the first transport device, detecting a positional relationship between the substrate held by the first holder and the first holder, acquiring a deviation between the target position and the reference position as correction information based on the detected positional relationship, correcting the target position to coincide with the reference position based on the acquired correction information during the teaching operation or during substrate processing, and transferring the substrate to the substrate supporter or receiving the substrate from the substrate supporter by moving the first holder to the corrected target position, during the substrate processing.

This substrate processing method causes the first holder of the first transport device to be moved to the target position in the substrate supporter and the substrate supported at the reference position in the substrate supporter to be received by the first holder, during the teaching operation regarding the first transport device. The positional relationship between the substrate held by the first holder and the first holder is detected. The deviation between the target position and the reference position is acquired as the correction information based on the detected positional relationship.

During the teaching operation or during the substrate processing, the target position is corrected to coincide with the reference position based on the acquired correction information. During the substrate processing, the first holder is moved to the corrected target position, so that the substrate is transferred to the substrate supporter by the first holder or the substrate is received from the substrate supporter by the first holder. Thus, the substrate can be transferred to the substrate supporter by the first holder to be supported at the reference position, or the first holder can be moved to the substrate supporter to receive the substrate supported at the reference position.

This configuration causes the first holder of the first transport device to receive the substrate supported at the reference position by the substrate supporter, so that the teaching operation regarding the first transport device is performed. Thus, a burden on the operator due to the teaching regarding the first transport device is reduced. In this case, it is not necessary to prepare the dedicated jig in order to perform the teaching regarding the first transport device. Therefore, a burden on the operator due to the maintenance and management of the jig does not occur, and a cost resulting from the purchase of the jig, and the maintenance and management of the jig does not occur either. As a result, the teaching regarding the first transport device can be performed at a low cost while a burden on the operator is reduced.

(14) A substrate processing method according to yet another aspect of the present invention for performing processing on a substrate includes the steps of detecting a positional relationship between the substrate held by a first holder of a first transport device and the first holder during a teaching operation regarding the first transport device, moving the first holder to a target position in a substrate supporter and transferring the substrate to the substrate supporter, rotating the substrate supported by the substrate supporter in a horizontal attitude about a reference position by a predetermined angle, moving the first holder to the target position in the substrate supporter and receiving the substrate supported by the substrate supporter, detecting a positional relationship between the substrate received from the substrate supporter and held by the first holder, and the first holder, acquiring a deviation between the target position and the reference position as correction information based on a positional relationship between the first holder and the substrate before the substrate is transferred to the substrate supporter and the positional relationship between the first holder and the substrate after the substrate is received from the substrate supporter, correcting the target position to coincide with the reference position based on the acquired correction information during the teaching operation or during substrate processing, and transferring the substrate to the substrate supporter or receiving the substrate from the substrate supporter by moving the first holder to the corrected target position during the substrate processing.

This substrate processing method causes the positional relationship between the substrate held by the first holder of the first transport device and the first holder to be detected during the teaching operation regarding the first transport device. The first holder of the first transport device is moved to the target position in the substrate supporter, and the substrate is transferred to the substrate supporter. The substrate supported by the substrate supporter in a horizontal attitude is rotated about the reference position by a predetermined angle. The first holder is moved to the target position in the substrate supporter, and the substrate supported by the substrate supporter is received and held by the first holder. Thereafter, the positional relationship between the substrate held by the first holder and the first holder is detected. The deviation between the target position and the reference position is acquired as the correction information based on the positional relationship between the first holder and the substrate before the substrate is transferred to the substrate supporter and the positional relationship between the first holder and the substrate after the substrate is received from the substrate supporter.

During the teaching operation or during the substrate processing, the target position is corrected to coincide with the reference position based on the acquired correction information. During the substrate processing, the first holder is moved to the corrected target position, so that the substrate is transferred to the substrate supporter by the first holder, or the substrate is received from the substrate supporter by the first holder. Thus, the substrate can be transferred to the substrate supporter by the first holder to be supported at the reference position, or the first holder can be moved to the substrate supporter to receive the substrate supported at the reference position.

This configuration causes the first holder of the first transport device to transfer the substrate to the substrate supporter and receive the rotated substrate, so that the teaching operation regarding the first transport device is performed. Thus, a burden on the operator due to the teaching regarding the first transport device is reduced. In this case, it is not necessary to prepare the dedicated jig in order to perform the teaching regarding the first transport device. Therefore, a burden on the operator due to the maintenance and management of the jig does not occur, and a cost resulting from the purchase of the jig, and the maintenance and management of the jig does not occur either. As a result, the teaching regarding the first transport device can be performed at a low cost while a burden on the operator is reduced.

(15) A substrate processing method according to yet another aspect of the present invention for performing processing on a substrate includes the steps of lifting a holder of a transport device from below the substrate supported at a reference height by a substrate supporter during a teaching operation regarding the transport device, detecting that the holder has held a lower surface of the substrate, determining a target height in a vertical direction based on a position of the holder in the vertical direction at a detection time point, and transferring the substrate to the substrate supporter or receiving the substrate from the substrate supporter by moving the holder to the determined target height when the holder is moved to the substrate supporter during substrate processing.

This substrate processing method causes the holder of the transport device to be lifted from below the substrate supported at the reference height by the substrate supporter during the teaching operation regarding the transport device. It is detected that the holder has held the lower surface of the substrate. The target height in the vertical direction is determined based on the position of the holder in the vertical direction at the detection time point. When the holder is moved to the substrate supporter during the substrate processing, the holder is moved to the determined target height, so that the substrate is transferred to the substrate supporter or the substrate is received from the substrate supporter. Thus, the substrate can be transferred to the substrate supporter by the holder to be supported at the reference height, or the holder can be moved to the substrate supporter to receive the substrate supported at the reference height.

This configuration causes the holder of the transport device to receive the substrate supported by the substrate supporter, so that the teaching operation in the vertical direction regarding the transport device is performed. Thus, a burden on the operator due to the teaching in the vertical direction regarding the transport device is reduced. In this case, it is not necessary to prepare the dedicated jig in order to perform the teaching operation regarding the transport device. Therefore, a burden on the operator due to the maintenance and management of the jig does not occur, and a cost resulting from the purchase of the jig, and the maintenance and management of the jig does not occur either. As a result, the teaching in the vertical direction regarding the transport device can be performed at a low cost while a burden on the operator is reduced.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 7 is a block diagram showing a configuration of a control system of the transport mechanism;

FIGS. 11A to 11C are diagrams for explaining a reference position when a substrate supporter is provided in a carrier;

DESCRIPTION OF THE PREFERRED EMBODIMENTS

A substrate processing apparatus and a substrate processing method according to one embodiment of the present invention will be described below with reference to the drawings. In the following description, a substrate refers to a semiconductor substrate, a substrate for a liquid crystal display device, a substrate for a plasma display, a substrate for an optical disk, a substrate for a magnetic disk, a substrate for a magneto-optical disk, a substrate for a photomask or the like.

(1) Configuration of Substrate Processing Apparatus

Figure 1:
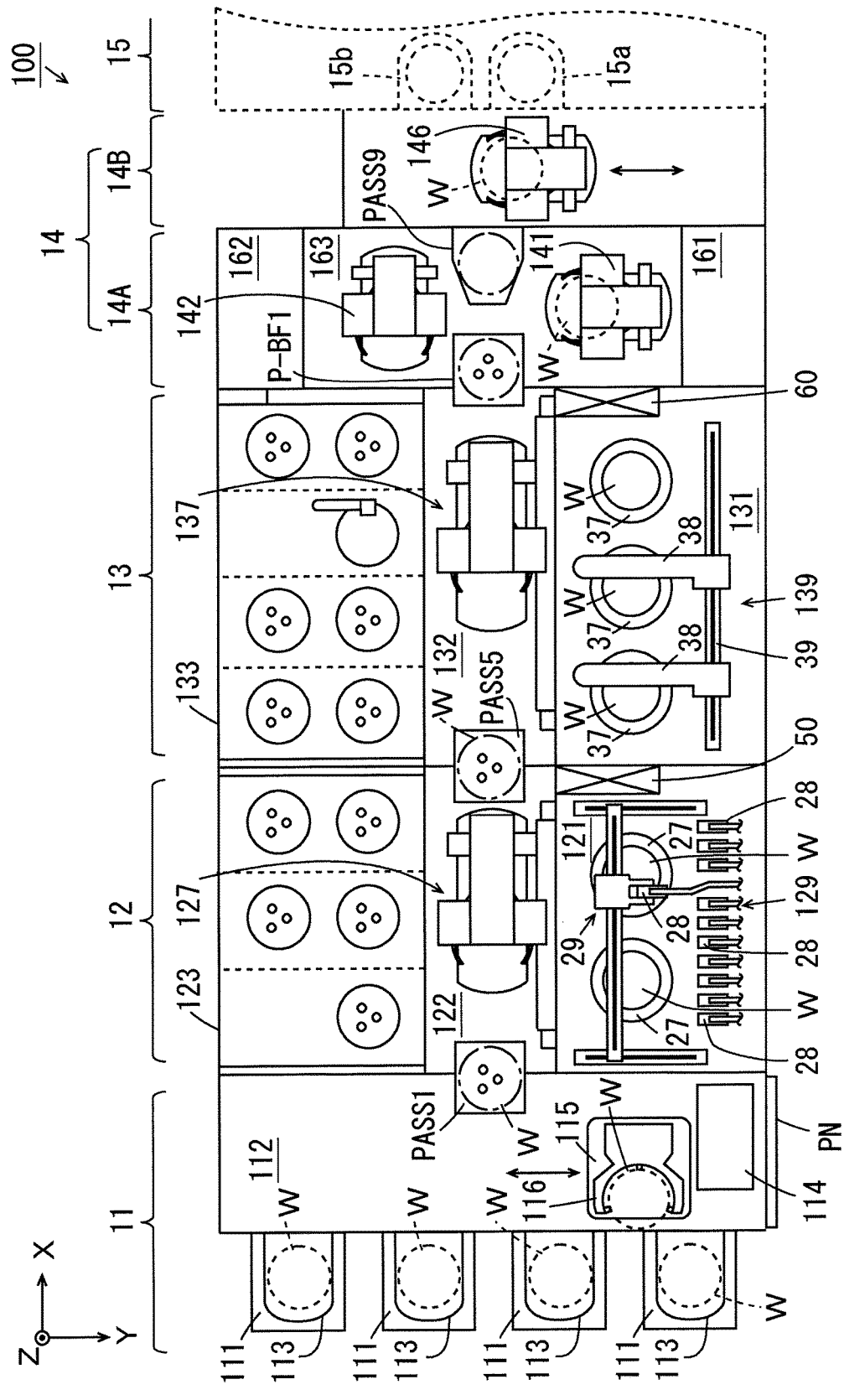
FIG. 1 is a schematic plan view of a substrate processing apparatus according to one embodiment of the present invention.

FIG. 1 is a schematic plan view of the substrate processing apparatus according to the one embodiment of the present invention.

FIG. 1 and subsequently given diagrams are accompanied by arrows that indicate X, Y, and Z directions orthogonal to one another for clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

As shown in FIG. 1, the indexer block 11 includes a plurality of carrier platforms 111 and a transport section 112. In each carrier platform 111, a carrier 113 for storing the plurality of substrates W in multiple stages is placed.

A controller 114 and a transport mechanism 115 are provided in the transport section 112. The controller 114 controls various constituent elements of the substrate processing apparatus 100. The transport mechanism 115 has a hand 116 for holding the substrate W. The transport mechanism 115 holds the substrate W by the hand 116 and transports the substrate W.

A main panel PN is provided on a side surface of the transport section 112. The main panel PN is connected to the controller 114. A user can confirm the processing status of the substrate W in the substrate processing apparatus 100 and other information on the main panel PN. An operation unit (not shown) composed of a keyboard, for example, is provided near the main panel PN. The user can set operation settings of the substrate processing apparatus 100 and the like by operating the operation unit.

The first processing block 12 includes a coating processing section 121, a transport section 122 and a thermal processing section 123. The coating processing section 121 and the thermal processing section 123 are provided to be opposite to each other with the transport section 122 sandwiched therebetween. Substrate platform PASS1, and substrate platforms PASS2 to PASS4 (see FIG. 4), described below, on which the substrates W are placed are provided between the transport section 122 and the indexer block 11. A transport mechanism 127 and a transport mechanism 128 (see FIG. 4) that is described below, which transport the substrates W, are provided in the transport section 122.

The second processing block 13 includes a development processing section 131, a transport section 132 and a thermal processing section 133. The development processing section 131 and the thermal processing section 133 are provided to be opposite to each other with the transport section 132 sandwiched therebetween. Substrate platform PASS5, and substrate platforms PASS6 to PASS8 (see FIG. 4), described below, on which the substrates W are placed are provided between the transport section 132 and the transport section 122. A transport mechanism 137 and a transport mechanism 138 (see FIG. 4) that is described below, which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 sandwiched therebetween. Transport mechanisms 141, 142 are provided in the transport section 163.

A placement buffer unit P-BF1 and a placement buffer unit P-BF2 (see FIG. 4) that is described below are provided between the transport section 163 and the transport section 132. The placement buffer units P-BF1, P-BF2 are configured to be capable of storing the plurality of substrates W.

Further, a substrate platform PASS9 and placement cooling platforms P-CP (see FIG. 4) that are described below are provided to be adjacent to the carry-in carry-out block 14B between the transport mechanisms 141, 142. In the placement cooling platform P-CP, the substrate W is cooled to a temperature suitable for the exposure processing.

A transport mechanism 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided at the exposure device 15.

Figure 2:
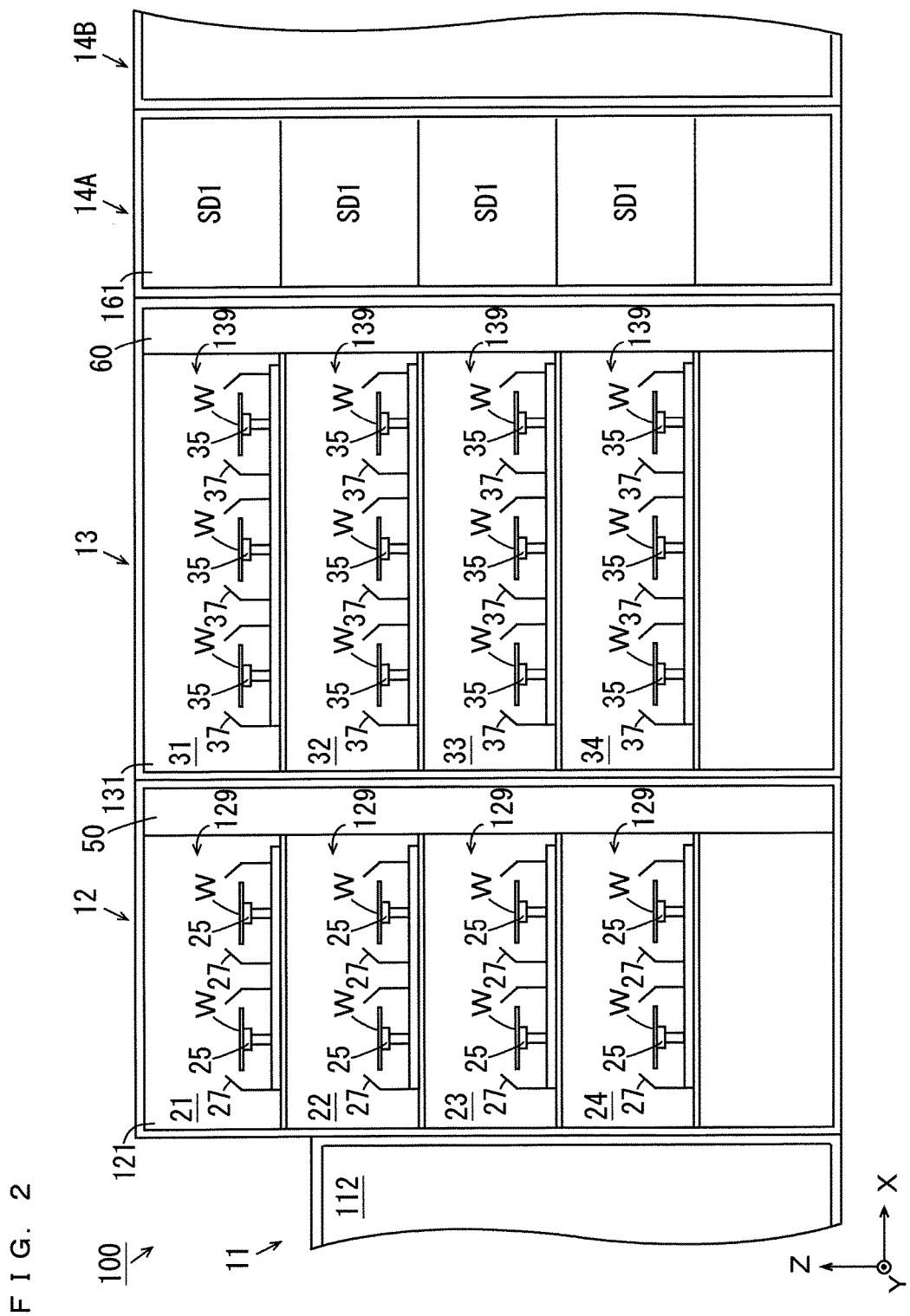
FIG. 2 is a schematic side view of the substrate processing apparatus mainly showing a coating processing section, a development processing section and a cleaning drying processing section of FIG. 1.

(2) Configuration of Coating Processing Section and Development Processing Section FIG. 2 is a schematic side view of the substrate processing apparatus 100 mainly showing the coating processing section 121, the development processing section 131 and the cleaning drying processing section 161 of FIG. 1.

As shown in FIG. 2, in the coating processing section 121, coating processing chambers 21, 22, 23, 24 are provided in a stack. In the development processing section 131, development processing chambers 31, 32, 33, 34 are provided in a stack. In each of the coating processing chambers 21 to 24, a coating processing unit 129 is provided. In each of the development processing chambers 31 to 34, a development processing unit 139 is provided.

Each coating processing unit 129 includes spin chucks 25 that hold the substrates W and cups 27 provided to cover the surroundings of the spin chucks 25. In the present embodiment, two pairs of the spin chucks 25 and the cups 27 are provided in each coating processing unit 129. Each spin chuck 25 is driven to be rotated by a driving device that is not shown (an electric motor, for example). Further, as shown in FIG. 1, each coating processing unit 129 includes a plurality of processing liquid nozzles 28 that discharge a processing liquid and a nozzle transport mechanism 29 that moves these processing liquid nozzles 28.

In the coating processing unit 129, the spin chuck 25 is rotated by the driving device (not shown), any one of the plurality of processing liquid nozzles 28 is moved to a position above the substrate W by the nozzle transport mechanism 29, and the processing liquid is discharged from the processing liquid nozzle 28. Thus, the processing liquid is applied to an upper surface of the substrate W. Further, a rinse liquid is discharged at a peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28.

Each development processing unit 139 includes spin chucks 35 and cups 37 similarly to the coating processing unit 129. Further, as shown in FIG. 1, the development processing unit 139 includes two development nozzles 38 that discharge a development liquid and a moving mechanism 39 that moves the development nozzles 38 in the X direction.

In the development processing unit 139, the spin chuck 35 is rotated by the driving device (not shown) and the one development nozzle 38 supplies the development liquid to each substrate W while moving in the X direction. Thereafter, the other development nozzle 38 supplies the development liquid to each substrate W while moving. In this case, the development liquid is supplied to the substrate W, so that development processing for the substrate W is performed. Further, in the present embodiment, development liquids that are different from each other are discharged from the two development nozzles 38. Thus, two types of the development liquids can be supplied to each substrate W.

A plurality (four in the present example) of cleaning drying processing units SD1 are provided in the cleaning drying processing section 161. In each cleaning drying processing unit SD1, cleaning and drying processing for the substrate W before the exposure processing are performed.

As shown in FIGS. 1 and 2, a fluid box 50 is provided in the coating processing section 121 to be adjacent to the development processing section 131. Similarly, a fluid box 60 is provided in the development processing section 131 to be adjacent to the cleaning drying processing block 14A. The fluid box 50 and the fluid box 60 each house fluid related elements such as pipes, joints, valves, flowmeters, regulators, pumps and temperature adjusters used to supply a chemical liquid to the coating processing units 129 and the development processing units 139, discharge the liquid and air out of the coating processing units 129 and the development processing units 139, and the like.

(3) Configuration of Thermal Processing Sections

Figure 3:
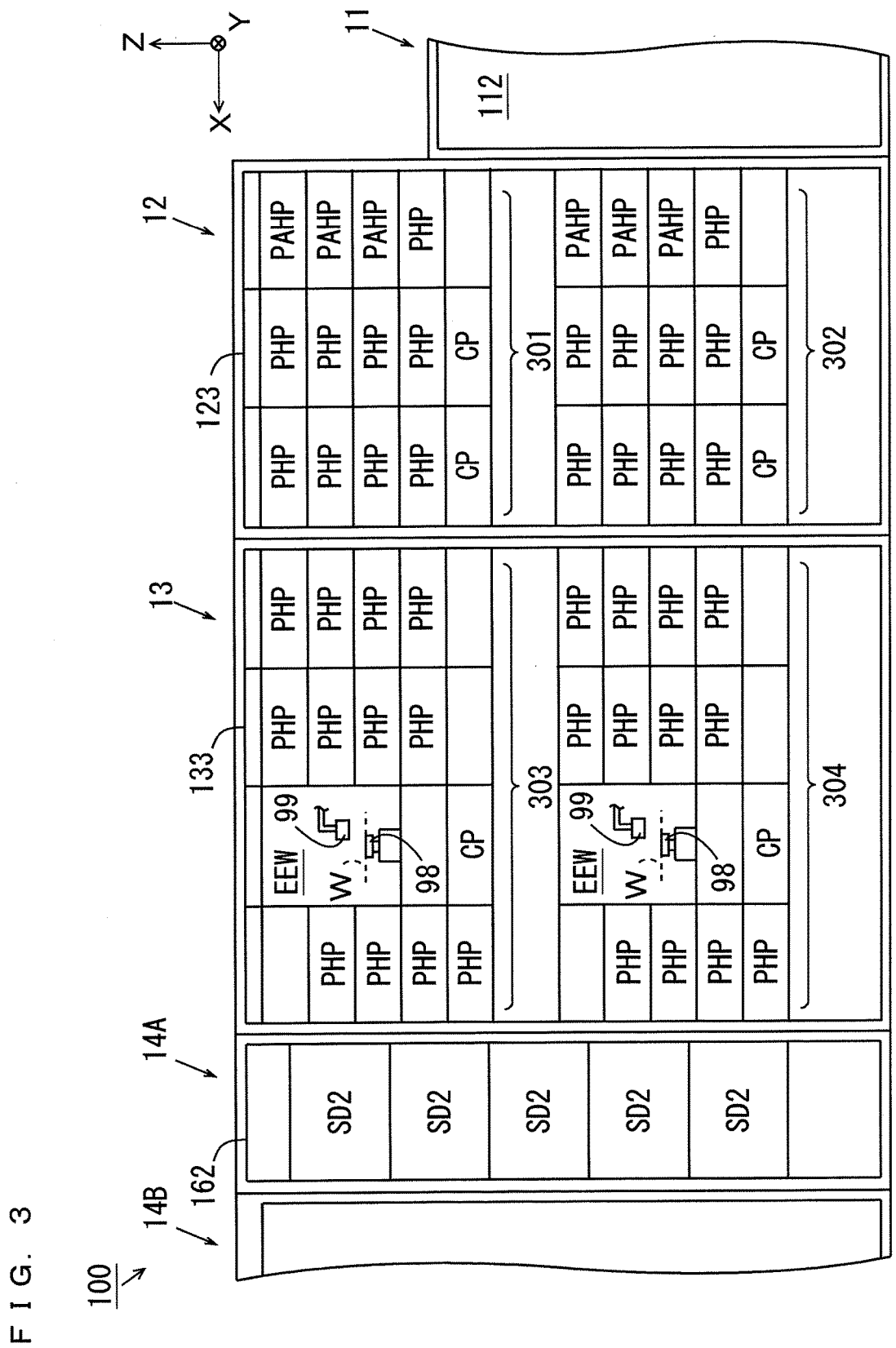
FIG. 3 is a schematic side view of the substrate processing apparatus mainly showing thermal processing sections and the cleaning drying processing section of FIG. 1.

FIG. 3 is a schematic side view of the substrate processing apparatus 100 mainly showing the thermal processing sections 123, 133 and the cleaning drying processing section 162 of FIG. 1. As shown in FIG. 3, the thermal processing section 123 has an upper thermal processing section 301 provided above, and a lower thermal processing section 302 provided below. In each of the upper thermal processing section 301 and the lower thermal processing section 302, a plurality of thermal processing units PHP, a plurality of adhesion reinforcement processing units PAHP and a plurality of cooling units CP are provided.

In each thermal processing unit PHP, heating processing for the substrate W is performed. In the adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. In each of the upper thermal processing section 303 and the lower thermal processing section 304, a cooling unit CP, a plurality of thermal processing units PHP and an edge exposure unit EEW are provided.

Each edge exposure unit EEW includes a spin chuck 98 that holds the substrate W by suction in a horizontal attitude while rotating the same, and a light emitting device 99 that exposes the outer peripheral edge of the substrate W held on the spin chuck 98. In the edge exposure unit EEW, exposure processing (edge exposure processing) is performed on a region with a constant width at the peripheral edge of the resist film formed on the substrate W. In the upper thermal processing section 303 and the lower thermal processing section 304, each thermal processing unit PHP provided to be adjacent to the cleaning drying processing block 14A is configured to be capable of carrying in the substrate W from the cleaning drying processing block 14A.

A plurality (five in the present example) of cleaning drying processing units SD2 are provided in the cleaning drying processing section 162. In each cleaning drying processing unit SD2, the cleaning and drying processing for the substrate W after the exposure processing is performed.

(4) Configuration of Transport Sections

Figure 4:
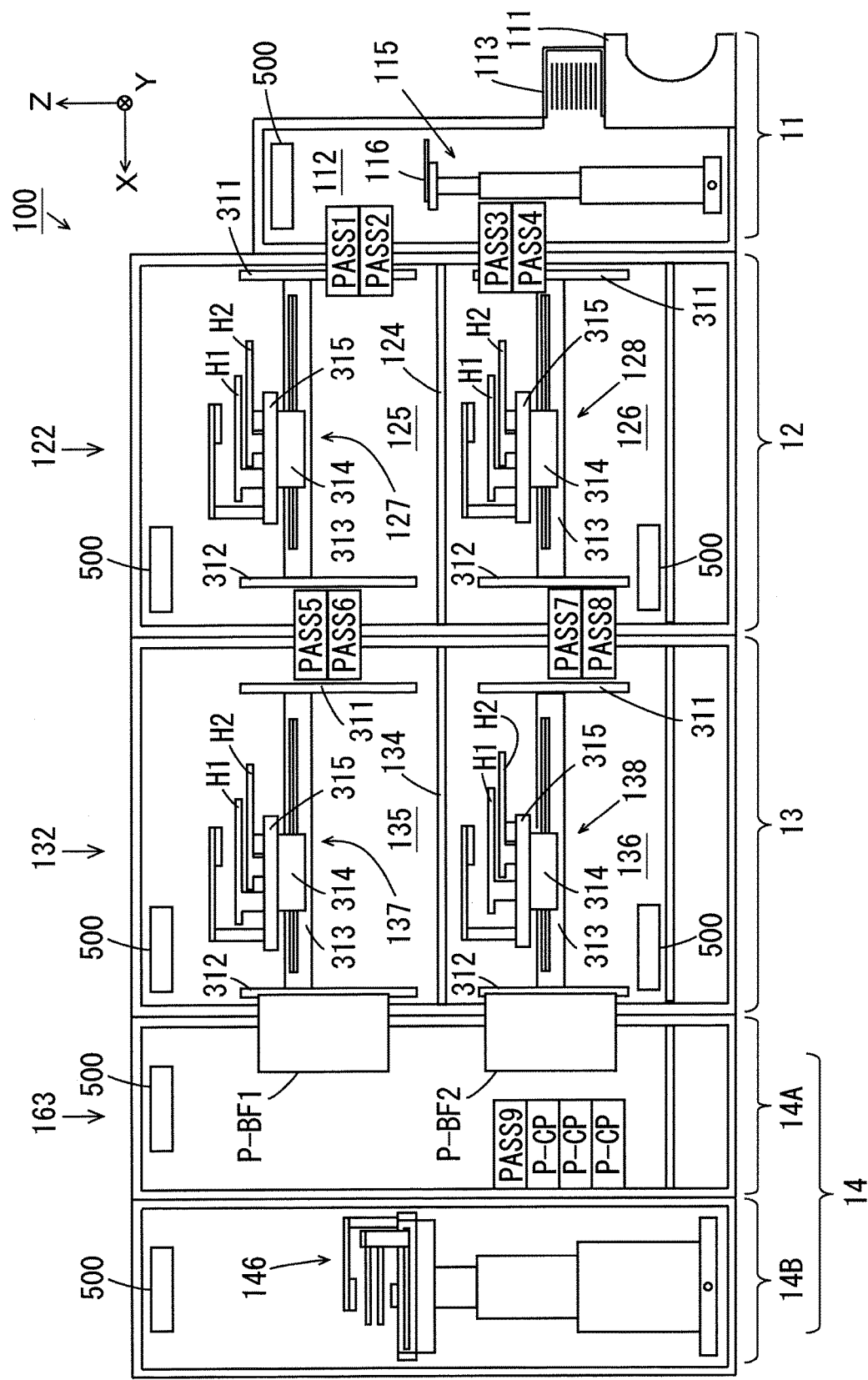
FIG. 4 is a side view mainly showing transport sections of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

As shown in FIG. 4, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided to be adjacent to the carry-in carry-out block 14B in the transport section 163.

The transport mechanism 127 is configured to be capable of transporting the substrate W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrate W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASSE, the placement buffer unit P-BF1, the development processing chambers 31, 32 (FIG. 2) and the upper thermal processing section 303 (FIG. 3). The transport mechanism 138 is configured to be capable of transporting the substrate W among the substrate platforms PASS7, PASS8, the placement buffer unit P-BF2, the development processing chambers 33, 34 (FIG. 2) and the lower thermal processing section 304 (FIG. 3).

A plurality of controllers 500 that respectively control the respective transport mechanisms 127, 128, 137, 138, 141, 142, 146 are provided in the transport sections 112, 122, 132, 163. Part of or all of the plurality of controllers 500 may be realized by the controller 114 of FIG. 1.

(5) Operation of Substrate Processing Apparatus

The operation of the substrate processing apparatus 100 will be described with reference to FIGS. 1 to 4. The carrier 113 in which the unprocessed substrates W are stored is placed on the carrier platform 111 (FIG. 1) in the indexer block 11. The transport mechanism 115 transports the unprocessed substrate W from the carrier 113 to the substrate platform PASS1, PASS3 (FIG. 4). Further, the transport mechanism 115 transports the processed substrate W that is placed on the substrate platform PASS2, PASS4 (FIG. 4) to the carrier 113.

In the first processing block 12, the transport mechanism 127 (FIG. 4) sequentially transports the substrate W placed on the substrate platform PASS1 to the adhesion reinforcement processing unit PAHP (FIG. 3), the cooling unit CP (FIG. 3) and the coating processing chamber 22 (FIG. 2). Next, the transport mechanism 127 sequentially transports the substrate W on which the anti-reflection film is formed by the coating processing chamber 22 to the coating processing chamber 22 (FIG. 2), the thermal processing unit PHP (FIG. 3), the cooling unit CP (FIG. 3) and the coating processing chamber 21 (FIG. 2). Then, the transport mechanism 127 sequentially transports the substrate W on which the resist film is formed by the coating processing chamber 21 to the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, the anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled to a temperature suitable for the formation of the resist film in the cooling unit CP. Next, in the coating processing chamber 21, the resist film is formed on the substrate W by the coating processing unit 129 (FIG. 2). Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 to the adhesion reinforcement processing unit PAHP (FIG. 3), the cooling unit CP (FIG. 3) and the coating processing chamber 24. Then, the transport mechanism 128 sequentially transports the substrate W on which the anti-reflection film is formed by the coating processing chamber 24 to the thermal processing unit PHP (FIG. 3), the cooling unit CP (FIG. 3) and the coating processing chamber 23. Subsequently, the transport mechanism 128 sequentially transports the substrate W on which the resist film is formed by the coating processing chamber 23 to the thermal processing unit PHP (FIG. 3) and the substrate platform PASS7 (FIG. 4).

Further, the substrate mechanism 128 (FIG. 4) transports the substrate W after the development processing that is placed on the substrate platform PASS8 (FIG. 4) to the substrate platform PASS4 (FIG. 4). The processing contents for the substrate W in the coating processing chambers 23, 24 (FIG. 2) and the lower thermal processing section 302 (FIG. 3) are similar to the processing contents for the substrate W in the above-mentioned coating processing chambers 21, 22 (FIG. 2) and upper thermal processing section 301 (FIG. 3).

In the second processing block 13, the transport mechanism 137 (FIG. 4) sequentially transports the substrate W after the resist film formation that is placed on the substrate platform PASS5 to the edge exposure unit EEW (FIG. 3) and the placement buffer unit P-BF1 (FIG. 4). In this case, in the edge exposure unit EWW, the edge exposure processing is performed on the substrate W. The substrate W after the edge exposure processing is placed on the placement buffer unit P-BF1.

Further, the transport mechanism 137 (FIG. 4) takes out the substrate W after the exposure processing and the thermal processing from the thermal processing unit PHP (FIG. 3) that is adjacent to the cleaning drying processing block 14A. The transport mechanism 137 sequentially transports the substrate W to the cooling unit CP (FIG. 3), any one of the development processing chambers 31, 32 (FIG. 2), the thermal processing unit PHP (FIG. 3) and the substrate platform PASS6 (FIG. 4).

In this case, after the substrate W is cooled to a temperature suitable for the development processing in the cooling unit CP, the development processing for the substrate W is performed by the development processing unit 139 in any one of the development processing chambers 31, 32. Thereafter, the thermal processing for the substrate W is performed in the thermal processing unit PHP, and the substrate W is placed on the substrate platform PASSE.

The transport mechanism 138 (FIG. 4) sequentially transports the substrate W after the resist film formation that is placed on the substrate platform PASS7 to the edge exposure unit EEW (FIG. 3) and the placement buffer unit P-BF2 (FIG. 4).

Further, the transport mechanism 138 (FIG. 4) takes out the substrate W after the exposure processing and the thermal processing from the thermal processing unit PHP (FIG. 3) that is adjacent to the interface block 14. The transport mechanism 138 sequentially transports the substrate W to the cooling unit CP (FIG. 3), any one of the development processing chambers 33, 34 (FIG. 2), the thermal processing unit PHP (FIG. 3) and the substrate platform PASS8 (FIG. 4). The processing contents for the substrate W in the development processing chambers 33, 34 and the lower thermal processing section 304 are similar to the processing contents for the substrate W in the above-mentioned development processing chambers 31, 32 and upper thermal processing section 303.

In the cleaning drying processing block 14A, the transport mechanism 141 (FIG. 1) transports the substrate W that is placed on the placement buffer unit P-BF1, P-BF2 (FIG. 4) to the cleaning drying processing unit SD1 (FIG. 2) in the cleaning drying processing section 161. Then, the transport mechanism 141 transports the substrate W from the cleaning drying processing unit SD1 to the placement cooling platform P-CP (FIG. 4). In this case, the substrate W is cooled in the placement cooling platform P-CP to a temperature suitable for the exposure processing in the exposure device 15 (FIG. 1) after the cleaning and drying processing for the substrate W are performed in the cleaning drying processing unit SD1.

The transport mechanism 142 (FIG. 1) transports the substrate W after the exposure processing that is placed on the substrate platform PASS9 (FIG. 4) to the cleaning drying processing unit SD2 (FIG. 3) in the cleaning drying processing section 162. Further, the transport mechanism 142 transports the substrate W after the cleaning and drying processing to the thermal processing unit PHP (FIG. 3) in the upper thermal processing section 303 or the thermal processing unit PHP (FIG. 3) in the lower thermal processing section 304 from the cleaning drying processing unit SD2. In this thermal processing unit PHP, post-exposure bake (PEB) processing is performed.

In the interface block 14, the transport mechanism 146 (FIG. 1) transports the substrate W before the exposure processing that is placed on the placement cooling platform P-CP (FIG. 4) to the substrate inlet 15a (FIG. 1) of the exposure device 15. Further, the transport mechanism 146 (FIG. 1) takes out the substrate W after the exposure processing from the substrate outlet 15b (FIG. 1) of the exposure device 15, and transports the substrate W to the substrate platform PASS9 (FIG. 4).

When the exposure device 15 cannot receive the substrate W, the substrate W before the exposure processing is temporarily stored in the placement buffer unit P-BF1, P-BF2. Further, when the development processing unit 139 (FIG. 2) in the second processing block 13 cannot receive the substrate W after the exposure processing, the substrate W after the exposure processing is temporarily stored in the placement buffer unit P-BF1, P-BF2.

In the present embodiment, processing for the substrate W in the coating processing chambers 21, 22, the development processing chambers 31, 32 and the upper thermal processing sections 301, 303 that are provided above, and the processing for the substrate W in the coating processing chambers 23, 24, the development processing chambers 33, 34 and the lower thermal processing sections 302, 304 that are provided below can be concurrently performed. Thus, it is possible to improve throughput without increasing a footprint.

(6) Configuration of Transport Mechanisms

Figure 5:
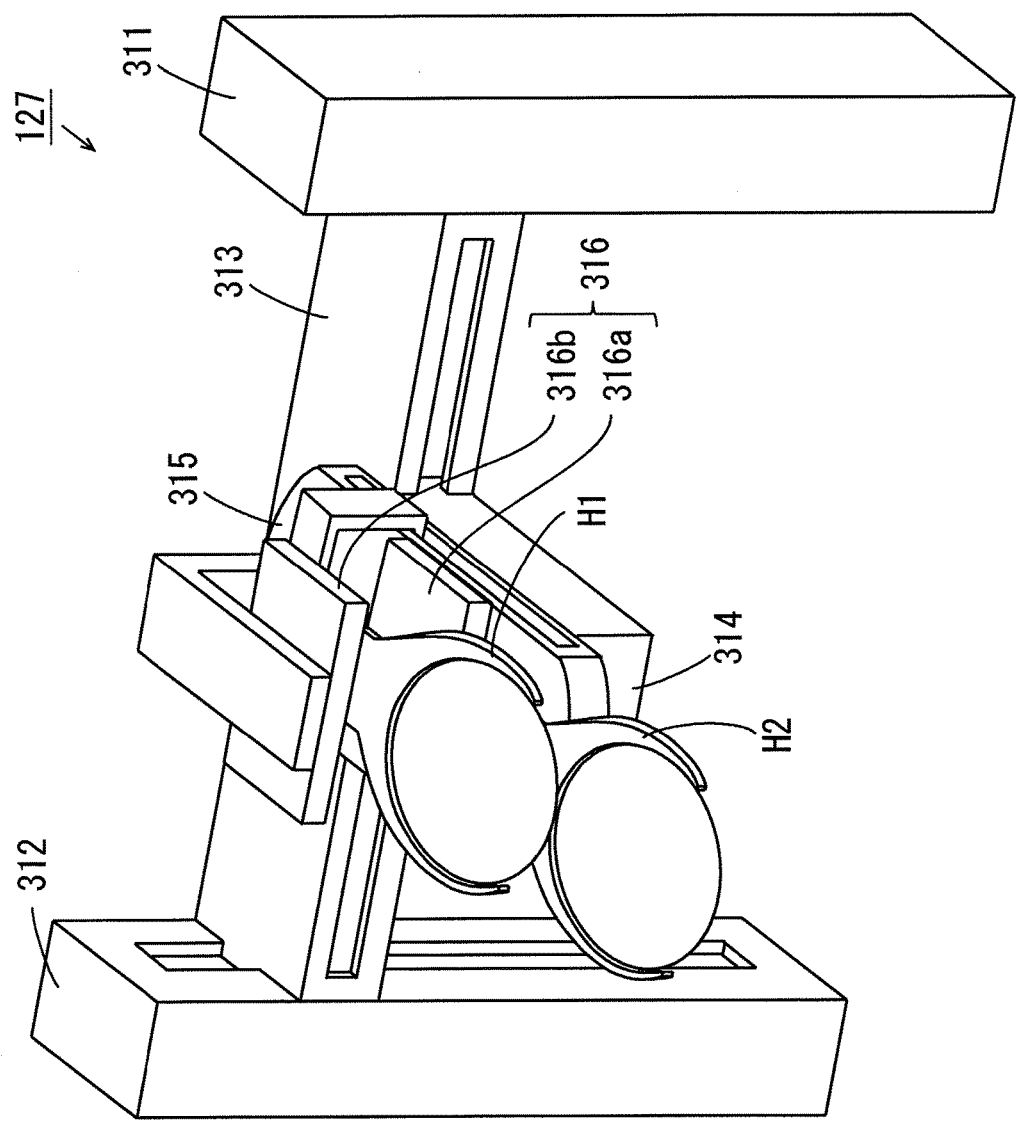
FIG. 5 is a perspective view showing a transport mechanism.

Next, the transport mechanism 127 will be described. FIG. 5 is a perspective view showing the transport mechanism 127. The transport mechanism 115, 128, 137, 138, 141, 142, 146 has the configuration similar to the transport mechanism 127. As shown in FIGS. 4 and 5, the transport mechanism 127 includes elongated guide rails 311, 312. As shown in FIG. 4, the guide rail 311 is fixed to the side of the transport section 112 to extend in the vertical direction in the upper transport chamber 125. The guide rail 312 is fixed to the side of the upper transport chamber 135 to extend in the vertical direction in the upper transport chamber 125.

As shown in FIGS. 4 and 5, an elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotating member 315 is rotatably provided on an upper surface of the moving member 314. A hand H1 and a hand H2 for holding the substrates W are attached to the rotating member 315. In the present example, the hand H1 is positioned above the hand H2. The hands H1, H2 are provided to be movable in a longitudinal direction of the rotating member 315.

The above-mentioned configuration enables the transport mechanism 127 to freely move in the X and Z directions in the upper transport chamber 125. Further, the transport mechanism 127 can receive the substrate W from and transfer the substrate W to the coating processing chamber 21, 22 (FIG. 2), the substrate platform PASS1, PASS2, PASS5, PASS6 (FIG. 4) or the upper thermal processing section 301 (FIG. 3) using the hand H1, H2.

Further, a sensor device 316 is attached to the rotating member 315. The sensor device 316 includes a light emitter holding casing 316a and a light receiver holding casing 316b. The light emitter holding casing 316a is arranged on an upper surface of the rotating member 315, and the light receiver holding casing 316b is arranged above the light emitter holding casing 316a.

Figure 6A:
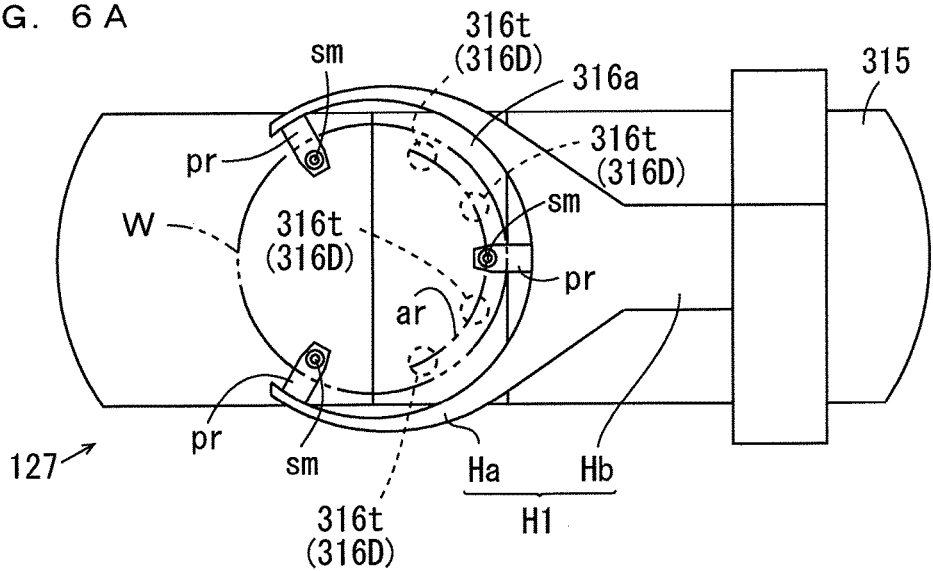
FIGS. 6A to 6C are a plan view, a side view and an end view showing the transport mechanism.
Figure 6B:
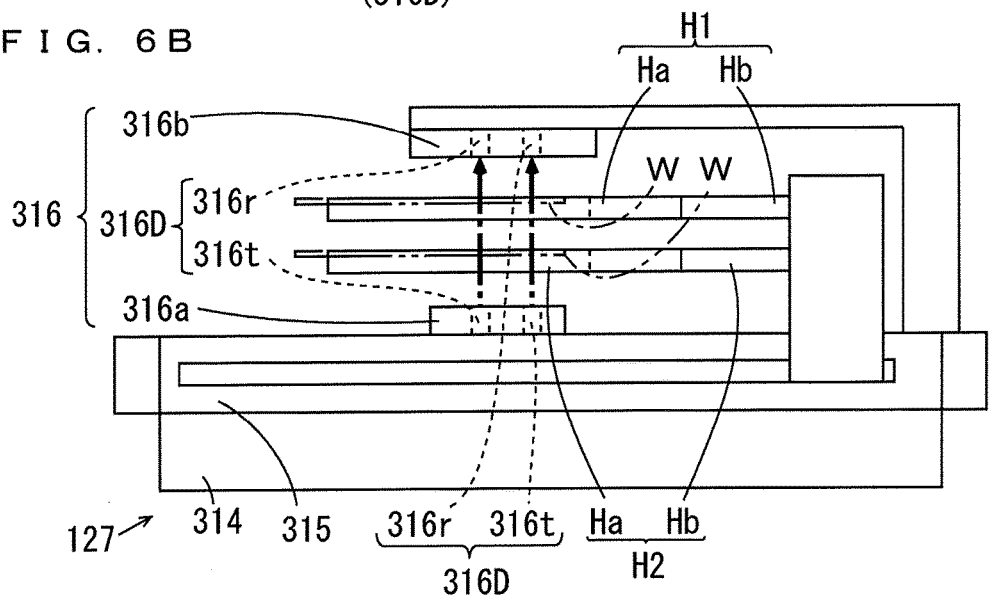
Figure 6C:
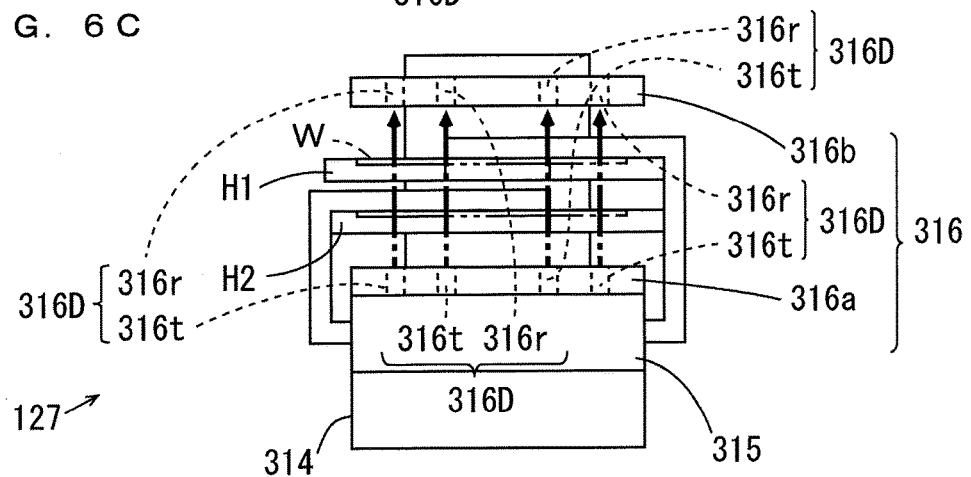

FIGS. 6A, 6B, 6C are a plan view, a side view and an end view showing the transport mechanism 127, respectively. As shown in FIG. 6A, the hand H1 is constituted by a guide portion Ha and an arm portion Hb. The guide portion Ha is substantially C-shaped, and the arm portion Hb is oblong. At an inner periphery of the guide portion Ha, a plurality (three in the present example) of projections pr are formed to be directed inward of the guide portion Ha at equal angular intervals about a center of a circle formed along the inner periphery of the guide portion Ha. A suction portion sm is provided at a tip end of each projection pr. Each suction portion sm is connected to an intake system (not shown).

In the hand H1, the substrate W is placed on the three suction portions sm of the three projections pr. In FIGS. 6A to 6C, the substrate W held by the hand H1 is indicated by two-dot and dash lines. In this state, the intake system connected to the three suction portions sm is controlled, and three portions of the substrate W positioned on the three suction portions sm are sucked by the three suction portions sm, respectively. The hand H1 may have the four suction portions sm. In this case, four portions of the substrate W positioned on the four suction portions sm are sucked by the four suction portions sm, respectively.

A suction signal indicating whether the plurality of suction portions sm are sucking the substrate W is supplied to the controller 500 of FIG. 4 from the hand H1. When the plurality of suction portions sm are sucking the substrate W, the suction signal enters an ON state, and when any one of the suction portions sm is not sucking the substrate W, the suction signal enters an OFF state.

The hand H2 has the configuration similar to the hand H1. In each hand H1, H2, a position at which the center of the held substrate W is to be positioned normally (hereinafter referred to as a normal position) is determined in advance. The normal position in the hand H1 is a central position of the circle formed along the inner periphery of the guide portion Ha, for example. The normal position in the hand H1 may be a central position of the plurality of suction portions sm.

Hereinafter, a limit position to which the hand H1, H2 can retreat in an advancing retreating direction of the hand H1, H2 is referred to as an advancing retreating reference position. In the examples of FIGS. 6A to 6C, the hands H1, H2 are respectively located at the advancing retreating reference positions.

The light emitter holding casing 316a is provided at substantially the center portion on the upper surface of the rotating member 315. In the light emitter holding casing 316a, a plurality (four in the present example) of light emitters 316t are held. The light receiver holding casing 316b is provided at a position above the rotating member 315 to be opposite to the light emitter holding casing 316a. In the light receiver holding casing 316b, a plurality (four in the present example) of light receivers 316r are held to be respectively opposite to the plurality of light emitters 316t held by the light emitter holding casing 316a. A detector 316D is constituted by the light emitter 316t and the light receiver 316r that are opposite to each other. As shown in FIG. 6C, in the present example, the sensor device 316 includes the four detectors 316D.

The four detectors 316D are arranged in an inner region of the guide portion Ha of the hand H1 located at the advancing retreating reference position in a horizontal plane. In the present example, the four detectors 316D are arranged at constant intervals on a circular arc ar concentric with the inner periphery of the guide portion Ha.

Light is emitted upward from the respective four light emitters 316t. The four light receivers 316r output light reception signals by respectively receiving the light emitted from the opposite four light emitters 316t as returning light. The light reception signal output from each light receiver 316r is supplied to the controller 500.

The four light emitters 316t are preferably arranged at positions further forward in the advancing retreating direction of the hand H1 than at least one suction portion sm of the plurality of suction portions sm of the hand H1 located at the advancing retreating reference position. In this case, the four portions at the outer periphery of the substrate W held by the hand H1 are respectively reliably detected by the four light emitters 316t during the transportation of the substrate W by the transport mechanism 127.

FIG. 7 is a block diagram showing a configuration of a control system of the transport mechanism 127. The configuration of the control system of the other transport mechanism 115, 128, 137, 138, 141, 142, 146 is similar to the configuration of the control system of the transport mechanism 127 of FIG. 7.

As shown in FIG. 7, the controller 500 includes a CPU (Central Processing Unit) 510 and a memory 520. In the memory 520, tentative target position coordinates, described below, are stored, and correction information, described below, is stored. The CPU 510 performs various calculation based on the light reception signals supplied from the sensor device 316 of the transport mechanism 127, and stores the results in the memory 520. Further, the operation of the transport mechanism 127 is controlled based on the information stored in the memory 520.

(7) Teaching Operation Regarding Transport Mechanism

The teaching operation regarding the transport mechanism when the hand H1, H2 of the transport mechanism 115, 127, 128, 137, 138, 141, 142, 146 is moved to a substrate supporter will be described. The substrate supporter is provided in each of the carrier 113, the substrate platforms PASS1 to PASS9 and the placement buffer units P-BF1, P-BF2, for example. Further, the substrate supporter is provided in each of the cooling units CP, the thermal processing units PHP, the adhesion reinforcement processing units PAHP, the placement cooling platforms P-CP and the cleaning drying processing units SD1, SD2, for example. Further, the substrate supporter is provided in each of the coating processing units 129, the development processing units 139 and the edge exposure units EEW, for example.

As the teaching operation, there are a teaching operation in the vertical direction and a teaching operation in the horizontal direction. In the following description, the teaching operation of the transport mechanism 127 will be explained. The teaching operation of the other transport mechanism 115, 128, 137, 138, 141, 142, 146 is similar to the teaching operation of the transport mechanism 127.

The height of the substrate W supported by the substrate supporter is referred to as a reference height. The height of the hand H1 when the hand H1 of the transport mechanism 127 transfers the substrate W to the substrate supporter or the height of the hand H1 when the hand H1 is moved to a position below the substrate supporter WS in order to receive the substrate W from the substrate supporter is referred to as a target height. The target height is determined by the teaching operation in the vertical direction.

Further, the position at which the substrate W is to be supported by the substrate supporter is referred to as a reference position. The position of the substrate W transferred to the substrate supporter by the hand H1 of the transport mechanism 127 before the teaching operation in the horizontal direction is referred to as a tentative target position. The correction information indicating a deviation between the reference position and the tentative target position is acquired by the teaching operation in the horizontal direction. The tentative target position is corrected to coincide with the target position based on the correction information. The corrected tentative target position is referred to as a true target position.

Except for a case in which the substrate supporter is the spin chuck 25 of the coating processing unit 129, the spin chuck 35 of the development processing unit 139 or the spin chuck 98 of the edge exposure unit EEW, the substrate W is automatically guided by a guide mechanism of the substrate supporter such that its center coincides with the reference position. On the other hand, when the substrate supporter is the spin chuck 25, 35, 98, the invention is not limited to that the center of the substrate W coincides with the reference position.

In the following description, positions in the X, Y, Z directions are indicated by X, Y, Z coordinates, respectively.

FIGS. 8A to 8D are diagrams for explaining the teaching operation in the vertical direction. FIGS. 8A to 8D show longitudinal cross sectional views of the substrate supporter WS and a substantially center portion of the hand H1 of the transport mechanism 127. In the example of FIGS. 8A to 8D, the target height in a case in which the hand H1 of the transport mechanism 127 is moved to a position below the substrate supporter WS is determined.

Figure 8A:
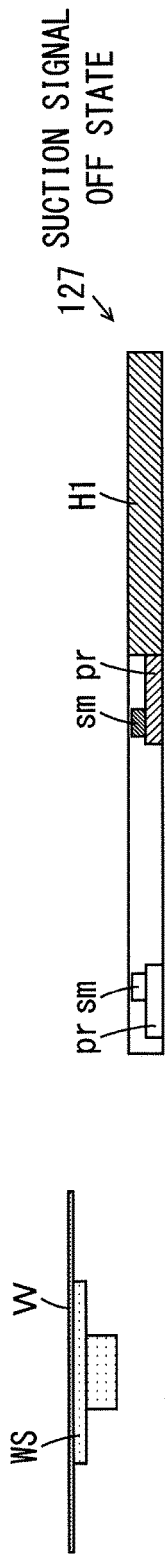
FIGS. 8A to 8D are diagrams for explaining a teaching operation in a vertical direction.
Figure 8B:
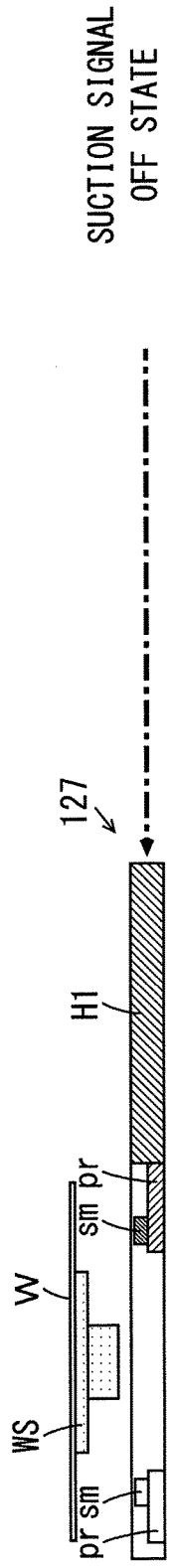

First, as shown in FIG. 8A, the substrate W is supported at the reference height by the substrate supporter WS. Next, as shown in FIG. 8B, the controller 500 moves the hand H1 from the advancing retreating reference position to a position below the substrate supporter WS in the horizontal direction. At this time point, the substrate W is not sucked by the plurality of suction portions sm of the hand H1. Therefore, the suction signal is in the OFF state. The transport mechanism 127 has an encoder. The controller 500 detects the position of the hand H1 based on the output signal of the encoder of the transport mechanism 127 at all times.

Figure 8C:
Figure 8D:
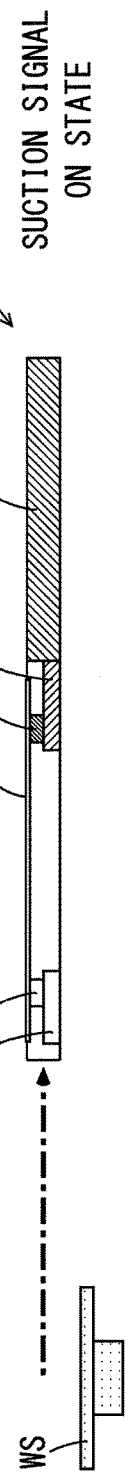

Subsequently, the controller 500 moves the hand H1 upward. In this case, as shown in FIG. 8C, the plurality of suction portions sm suck the substrate W at a time point at which the hand H1 is moved upward by a predetermined distance. Thus, the suction signal enters the ON state. The controller 500 determines the Z coordinate of the hand H1 at a time point at which the suction signal enters the ON state or a coordinate, which a predetermined offset amount in the vertical direction is added to the Z coordinate, as the Z coordinate of the target height. The Z coordinate of the target height is stored in the memory 520 of the controller 500. Thereafter, as shown in FIG. 8D, the controller 500 moves the hand H1 to the advancing retreating reference position in the horizontal direction after moving the hand H1 to a position above the substrate supporter WS.

Figure 9A:
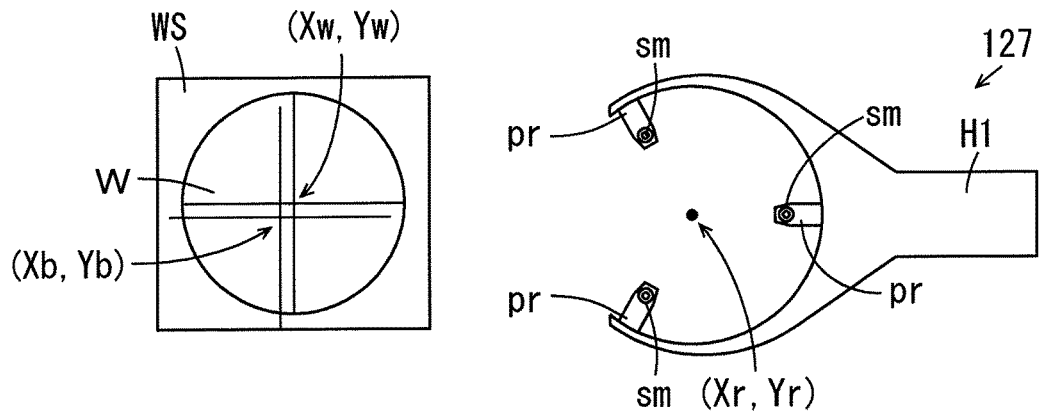
FIGS. 9A to 9C are diagrams for explaining a teaching operation in a horizontal direction.
Figure 9B:
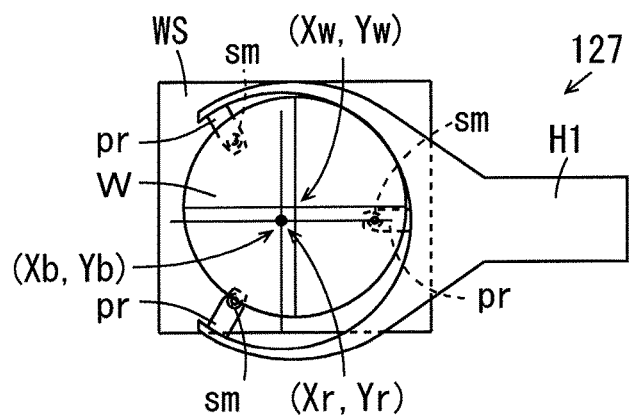
Figure 9C:
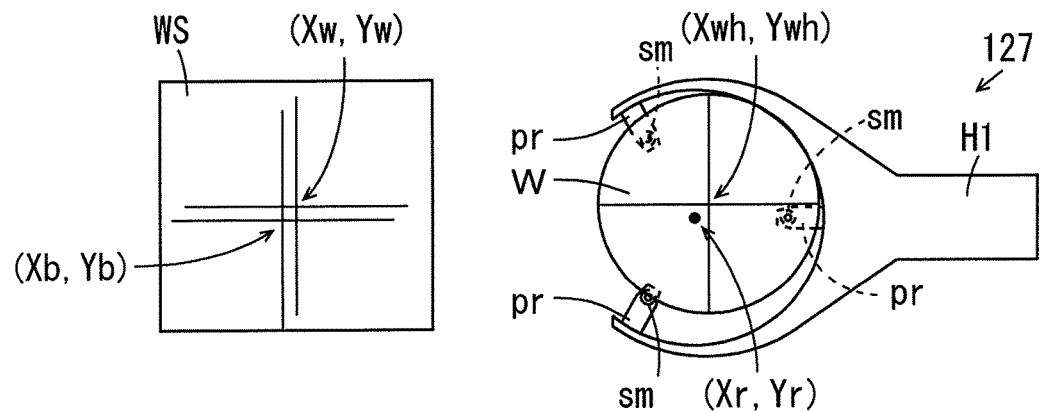

FIGS. 9A to 9C are diagrams for explaining the teaching operation in the horizontal direction. FIGS. 9A to 9C show plan views of the substrate supporter WS and the hand H1 of the transport mechanism 127. In the example of FIGS. 9A to 9C, the correction information regarding the substrate supporter WS is acquired using the hand H1 of the transport mechanism 127.

First, as shown in FIG. 9A, the substrate W is supported on the substrate supporter WS. The substrate W is supported with its center accurately coinciding with the reference position. On the other hand, the controller 500 does not identify the reference position in the substrate supporter WS before the teaching operation in the horizontal direction. Therefore, the invention is not limited to that the tentative target position coincides with the reference position.

Hereinafter, the coordinates of the reference position are referred to as reference position coordinates, and the coordinates of the tentative target position are referred to as tentative target position coordinates. Further, the coordinates of the normal position on the hand H1 are referred to as normal position coordinates. The reference position coordinates are (Xw, Yw), the tentative target position coordinates are (Xb, Yb), and the normal position coordinates are (Xr, Yr). The tentative target position coordinates are stored in the memory 520 of the controller 500. In the example of FIG. 9A, the reference position coordinates (Xw, Yw) do not coincide with the tentative target position coordinates (Xb, Yb).

In the state of FIG. 9A, the controller 500 lifts the substrate W to a position above the substrate supporter WS by lifting a plurality of lift pins (not shown) from below towards above the substrate supporter WS. Next, the hand H1 is moved in the horizontal direction from the advancing retreating reference position such that the normal position of the hand H1 coincides with the tentative target position. At this time point, the hand H1 is positioned above the substrate supporter WS and below the substrate W.

Subsequently, the controller 500 lowers the substrate W by lowering the plurality of lift pins (not shown). Thus, as shown in FIG. 9B, the substrate W is sucked by the plurality of suction portions sm of the hand H1. In this case, the substrate W is held by the hand H1 with its center deviating from the normal position.

Thereafter, as shown in FIG. 9C, the controller 500 moves the hand H1 to the advancing retreating reference position in the horizontal direction. The hand H1 retreats from a position further forward than the sensor device 316 to the advancing retreating reference position on the rotating member 315 of FIGS. 5 to 6C, so that the plurality of portions at the outer periphery of the substrate W held by the hand H1 are respectively detected. Details regarding a method of detection of the outer periphery of the substrate W held by the hand H1 will be described below.

The controller 500 detects the position of the center of the substrate W in the hand H1 (hereinafter referred to as a detection position) based on a result of detection of the plurality of portions at the outer periphery of the substrate W. Hereinafter, the coordinates of the detection position are referred to as detection position coordinates. The detection position coordinates are (Xwh, Ywh). Next, deviations of the reference position coordinates (ΔX, ΔY) from the tentative target position coordinates in the X and Y directions are calculated as the correction information based on the following formulas (1), (2).

$$\Delta X = Xr - Xwh \quad (1)$$

$$\Delta Y = Yr - Ywh \quad (2)$$

Subsequently, the controller 500 calculates the coordinates of the true target position (hereinafter referred to as true target position coordinates) based on the following formulas (3), (4). The true target position coordinates are (Xrb, Yrb). The true target position coordinates (Xrb, Yrb) are stored in the memory 520 of the controller 500.

$$Xrb = Xb - \Delta X \quad (3)$$

$$Yrb = Yb - \Delta Y \quad (4)$$

Thus, the true target position coordinates (Xrb, Yrb) coincide with the reference position coordinates (Xw, Yw).

During the processing for the substrate W, the controller 500 controls the transport mechanism 127 such that the hand H1 is moved to the true target position. As a result, the substrate W is transferred to the substrate supporter WS by the hand H1 such that the center of the substrate W coincides with the reference position in the substrate supporter WS. Further, the substrate W is received from the substrate supporter WS by the hand H1 to be held at the normal position of the hand H1.

While the teaching operation using the hand H1 of the transport mechanism 127 is described in the above-mentioned example, the teaching operation using the hand H2 is similar to the teaching operation using the hand H1. Further, the transport mechanism 115, 128, 137, 138, 141, 142, 146 has the configuration and operation similar to the transport mechanism 127. Therefore, the teaching operation using the transport mechanism 115, 128, 137, 138, 141, 142, 146 is similar to the teaching operation using the transport mechanism 127.

(8) Method of Detection of Outer Periphery of Substrate

FIGS. 10A to 10H are diagrams for explaining the method of detection of the plurality of portions at the outer periphery of the substrate W by the sensor device 316 of FIGS. 5 to 6C. In FIGS. 10A, 10C, 10E, 10G, changes in condition of the hand H1, the rotating member 315 and the plurality of detectors 316D when the hand H1 retreats towards the advancing retreating reference position are shown in plan views. Schematic cross sectional views taken along the line Q-Q of FIGS. 10A, 10C, 10E, 10G are respectively shown in FIGS. 10B, 10D, 10F, 10H. Explanation regarding the hand H2 is omitted.

First, at a time point at which the substrate W is received by the hand H1, the hand H1 is positioned at a position further forward than the four detectors 316D. In this case, the hand H1 is not positioned between the four light emitters 316t and the four light receivers 316r. Therefore, the four light receivers 316r receive the light from the opposite four light emitters 316t, respectively. Thus, the light reception signals are supplied to the controller 500.

Figure 10A:
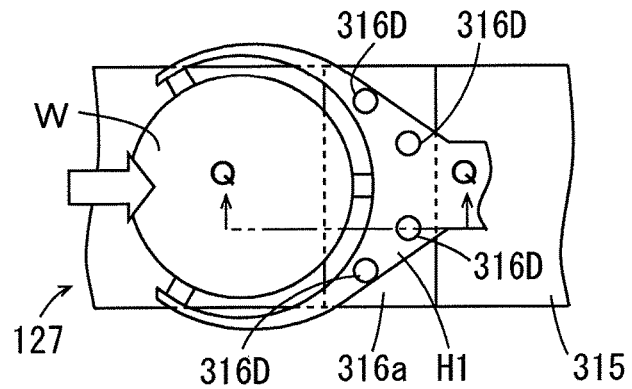
FIG. 10A to 10H are diagrams for explaining a method of detection of a plurality of portions at an outer periphery of the substrate by a sensor device of FIGS. 5 to 6C.
Figure 10B:
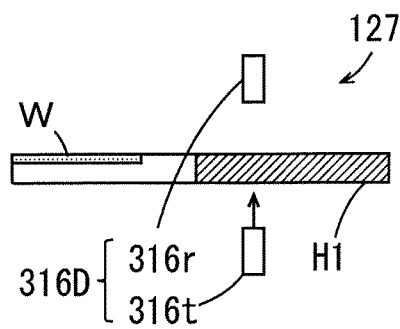

Next, the hand H1 retreats. In this case, as shown in FIGS. 10A, 10B, the hand H1 enters the space between the four light emitters 316t and the four light receivers 316r. At this time, the light emitted from the four light emitters 316t is shielded by the hand H1, so that the four light receivers 316r do not receive the light from the opposite four light emitters 316t, respectively. Therefore, the light reception signals are not supplied to the controller 500.

Figure 10C:
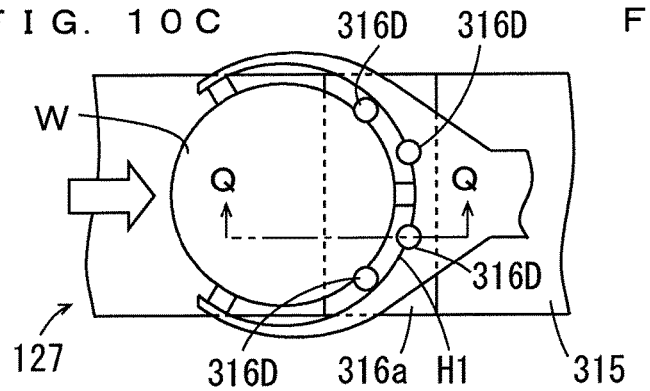
Figure 10D:
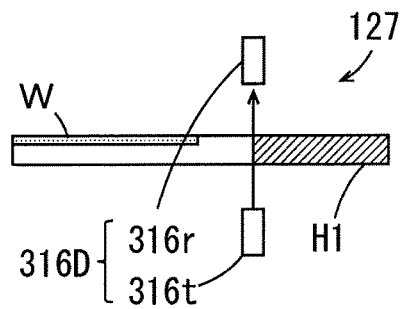

Next, as shown in FIGS. 10C, 10D, the hand H1 passes through the space between the four light emitters 316t and the four light receivers 316r. At a time point at which the hand H1 passes through a space between each light emitter 316t and the light receiver 316r opposite to the light emitter 316t, each light receiver 316r receives the light from the opposite light emitter 316t. Thus, the light reception signal is supplied to the controller 500.

Figure 10E:
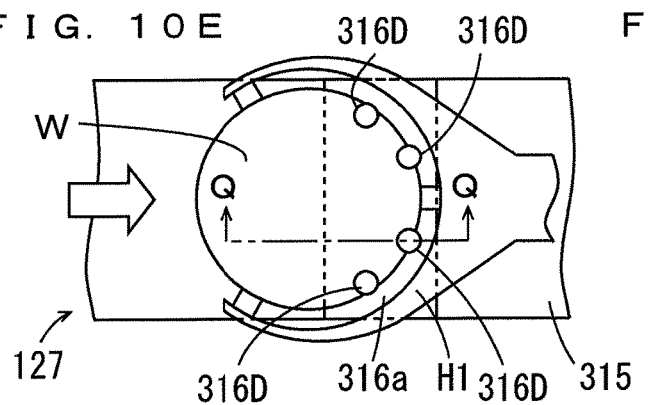
Figure 10F:
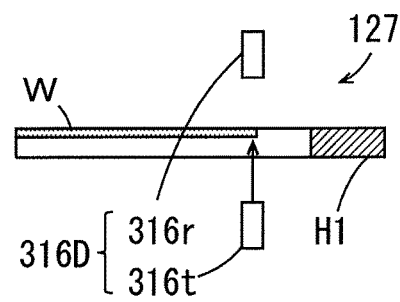

Next, as shown in FIGS. 10E, 10F, the substrate W held by the hand H1 enters the space between the four light emitters 316t and the four light receivers 316r. At a time point at which the outer periphery of the substrate W held by the hand H1 enters the space between each light emitter 316*t* and the light receiver 316*r* opposite to the light emitter 316*t*, the light emitted from each light emitter 316*t* is shielded by the outer periphery of the substrate W. In this case, each light receiver 316*r* does not receive the light from the opposite light emitter 316*t*. Therefore, the light reception signal is not supplied to the controller 500.

Figure 10G:
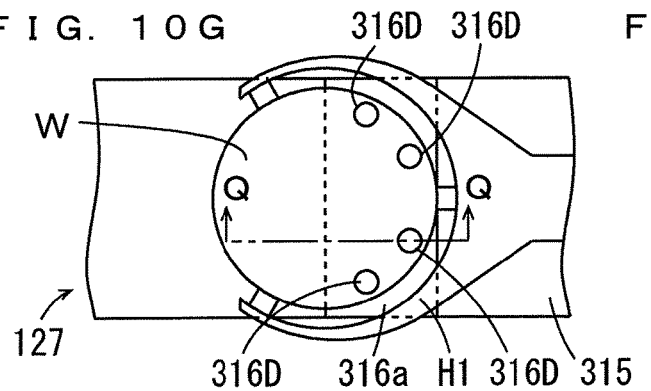
Figure 10H:
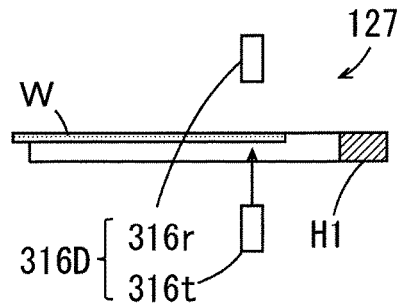

Next, as shown in FIGS. 10G, 10H, the hand H1 is stopped at the advancing retreating reference position. At this time, the substrate W held by the hand H1 is positioned in the space between the four light emitters 316*t* and the four light receivers 316*r*. In this case, the four light receivers 316*r* do not receive the light from the opposite four light emitters 316*t*, respectively. Therefore, the light reception signal is not supplied to the controller 500.

As described above, the light reception signals are respectively intermittently supplied from the four light receivers 316*r* of the four detectors 316D to the controller 500 until the hand H1 is moved to the advancing retreating reference position after the substrate W is received by the hand H1.

The four portions at the outer periphery of the substrate W are detected based on a time point at which the supply of the light reception signal from each of the four light receivers 316*r* is stopped due to the outer periphery of the substrate W (the time point of FIGS. 10E, 10F). Normal data is stored in the memory 520 of the controller 500 in advance. The normal data is the data indicating the results of detection of the four portions at the outer periphery of the substrate W acquired when the hand H1 is moved from a position in front of the sensor device 316 to the advancing retreating reference position with the center of the substrate W being located at the normal position of the hand H1.

The sensor device 316 is fixed to the rotating member 315. Therefore, the positions of the plurality of detectors 316D of the sensor device 316 on the coordinates are not changed. The controller 500 calculates the coordinates indicating the positions of the four portions at the outer periphery of the substrate W when the hand H1 is at the advancing retreating reference position based on the differences between the results of detection of the four portions at the outer periphery of the substrate W and the results of detection of the four portions of the normal data. The coordinates of the position of the center of the substrate W when the hand H1 is located at the advancing retreating reference position are calculated based on the calculated coordinates of the positions of the four portions.

The coordinates of the position of the center of the substrate W in the hand H1 can be calculated based on coordinates of three portions at the outer periphery of the substrate W. In the present example, the coordinates of the four portions at the outer periphery of the substrate W are acquired. Thus, even when one portion of the four portions is a cutout portion (an orientation flat or a notch) for positioning the substrate W, for example, the coordinates of the position of the center of the substrate W can be calculated based on the coordinates of the three portions except for the coordinates of the cutout portion. When an outer diameter of the substrate W is known, the coordinates of the position of the center of the substrate W can be calculated based on coordinates of two portions at the outer periphery of the substrate W. In this case, the sensor device 316 may be constituted by the two or three detectors 316D.

(9) Reference Position in Substrate Supporter

As described above, in the teaching operation, the substrate W is supported with its center accurately coinciding with the reference position in the substrate supporter WS expect for a case in which the substrate supporter WS is the spin chuck 25, 35, 98. The reference positions are different from one another depending on the types of the substrate supporters WS. The reference position in the substrate supporter WS will be described below.

(a) Carriers

FIGS. 11A to 11C are diagrams for explaining the reference position when the substrate supporter WS is provided in the carrier 113. In the example of FIGS. 11A to 11C, the carrier 113 is a FOUP (Front Opening Unified Pod). The carrier 113 may be an SMIF (Standard Mechanical Inter Face) pod, an OC (Open Cassette) that exposes the stored substrates W to outside air or the like instead of the FOUP.

As shown in FIG. 11A to 11C, the carrier 113 is constituted by a casing 113*a* having an open front surface, and a lid 113*b* provided to be capable of opening and closing an opening of the casing 113*a*. FIG. 11A shows a schematic side view of the carrier 113 when the lid 113*b* is in a close state. As shown in FIG. 11A, when the lid 113*b* is in the close state, the plurality of substrates W are stored in the casing 113*a* to be arranged in a longitudinal direction with their outer peripheries being aligned with one another. In the present example, the casing 113*a* is the substrate supporter WS. Further, a sidewall of the casing 113*a* and the lid 113*b* constitute the guide mechanism.

FIGS. 11B, 11C show schematic side views of the carrier 113 when the lid 113*b* is in an open state. When the lid 113*b* is in the open state, the arrangement of the plurality of substrates W are not changed as shown in FIG. 11B under normal conditions. In this case, an initial position of a center of any one of the substrates W is the reference position.

On the other hand, when the lid 113*b* is in the open state, the arrangement of parts of the substrates W are sometimes changed under abnormal conditions as shown in FIG. 11C. Therefore, the parts of the substrates W are sometimes moved to project forward of the other substrates W. In this case, the controller 500 takes out the plurality of substrates W from the casing 113*a* using the transport mechanism 115 of FIG. 1, and acquires the detection positions, of the plurality of substrates W that are taken out, by the above-mentioned method. A position selected from an average value, a maximum value, a minimum value or the like of the acquired detection positions of the plurality of substrates W is the reference position.

(b) Substrate Platforms

Figure 12:
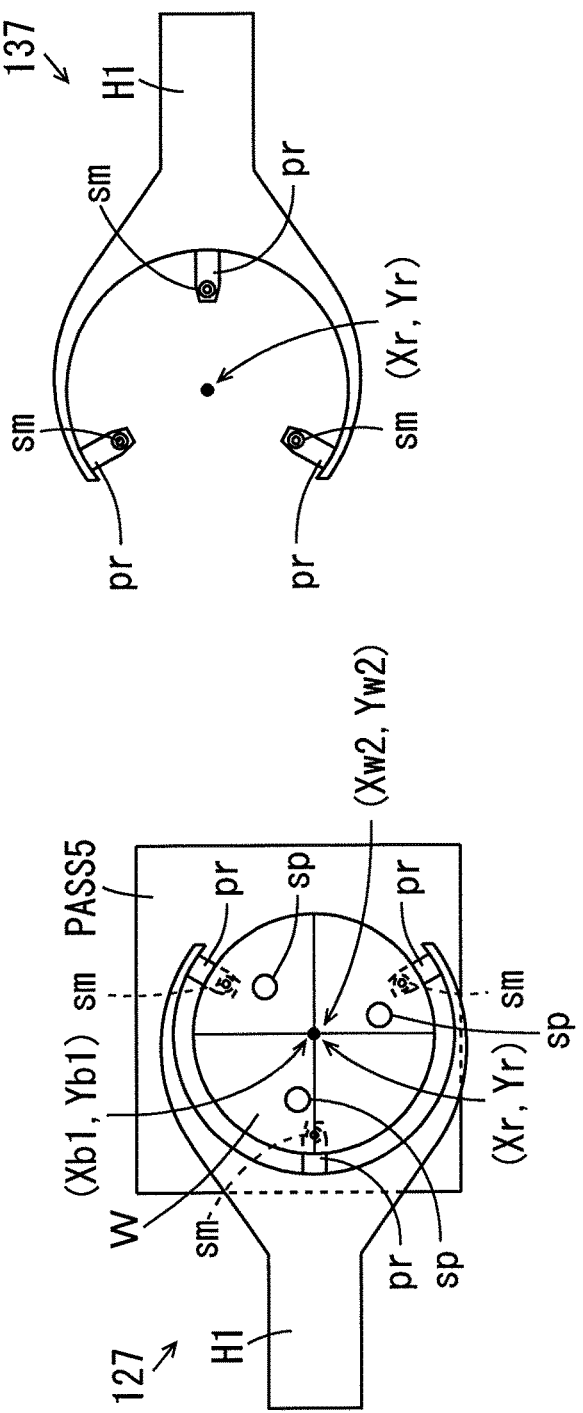
FIG. 12 is a diagram for explaining the reference position when the substrate supporter is provided in a substrate platform.

FIG. 12 is a diagram for explaining the reference position when the substrate supporter WS is provided in the substrate platform PASS1 to PASS9. FIG. 12 is a schematic plan view of the transport mechanisms 127, 137 and the substrate platform PASS5. The substrate platform PASS5 has more than two support pins sp. In the example of FIG. 12, the support pins sp of the substrate platform PASS5 are the substrate supporter WS. It is considered that the substrate W is transported from the transport mechanism 127 to the transport mechanism 137 via the substrate platform PASS5. The reference position in the substrate platform PASS1 to PASS4, PASS6 to PASS9 is similar to the below-mentioned reference position in the substrate platform PASS5.

As shown in FIG. 12, the controller 500 places the substrate W on the support pins sp of the substrate platform PASS5 by the transport mechanism 127. The center of the substrate W placed on the substrate platform PASS5 is the tentative target position. The tentative target position coordinates in the substrate platform PASS5 corresponding to the transport mechanism 127 are (Xb1, Yb1). In this case, the tentative target position coordinates (Xb1, Yb1) are considered to be the reference position coordinates (Xw2, Yw2) in the substrate platform PASS5 corresponding to the transport mechanism 137. That is, the tentative target position in the substrate platform PASS5 corresponding to the transport mechanism 127 is considered to be the reference position in the substrate platform PASS5 corresponding to the transport mechanism 137.

(c) Placement Buffer Units

The placement buffer unit P-BF1, P-BF2 of FIG. 4 has a function as a substrate platform similar to the substrate platform PASS1 to PASS9, and a function as a buffer unit that temporarily stores the substrate W. The reference position when the placement buffer unit P-BF1, P-BF2 functions as the substrate platform is similar to the reference position in the substrate platform PASS1 to PASS9.

On the other hand, when the placement buffer unit P-BF1, P-BF2 functions as the buffer unit, the substrate W is carried into and carried out from the placement buffer unit P-BF1, P-BF2 by the same transport mechanism (any one of the transport mechanisms 141, 142). Therefore, the position of the substrate W on the hand (not shown) of the transport mechanism 141, 142 is not changed before carrying of the substrate W into the placement buffer unit P-BF1, P-BF2 and after carrying of the substrate W out from the placement buffer unit P-BF1, P-BF2. Therefore, any position of the placement buffer unit P-BF1, P-BF2 may be the reference position.

Figure 13:
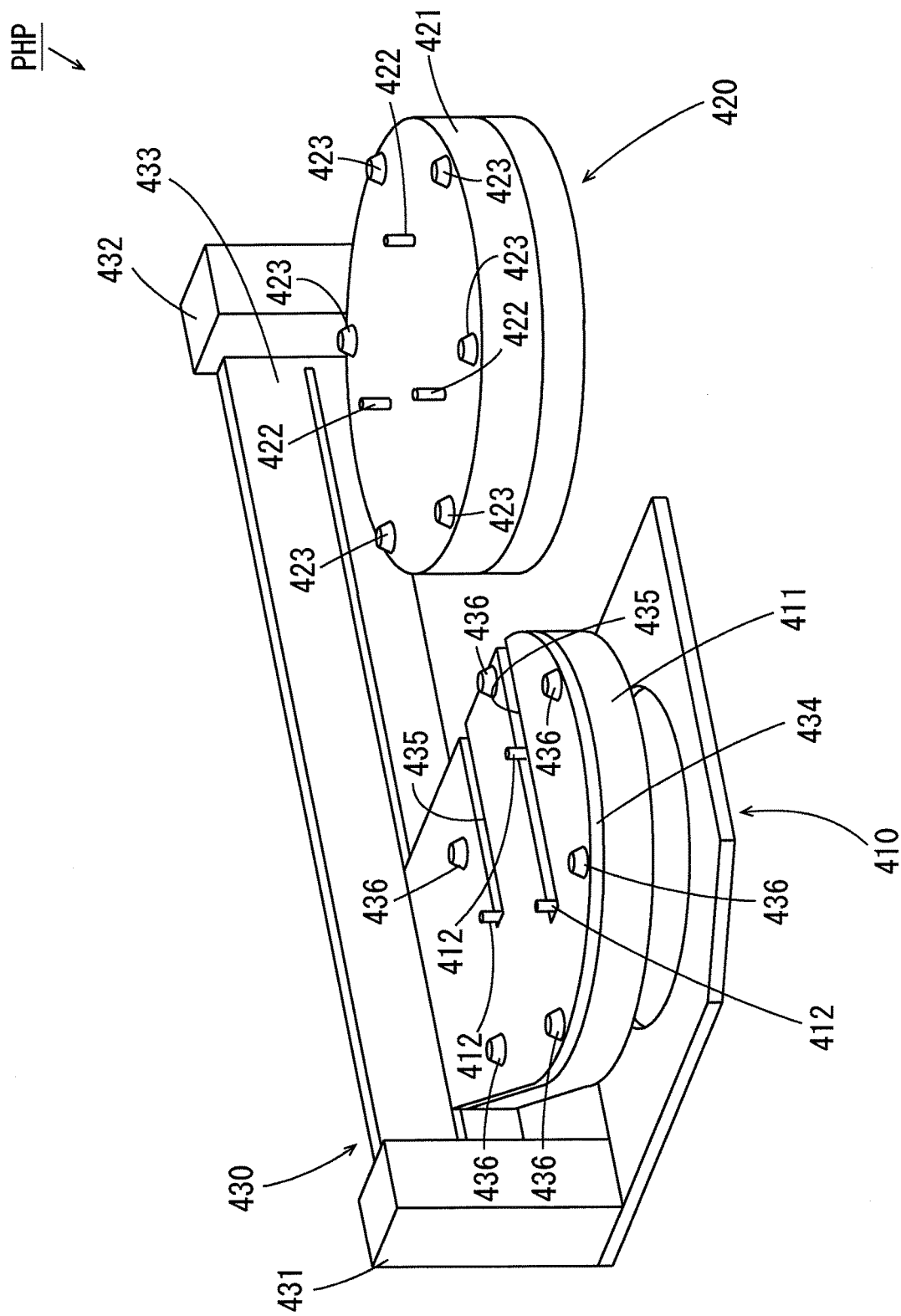
FIG. 13 is a perspective view of a thermal processing unit.
Figure 14:
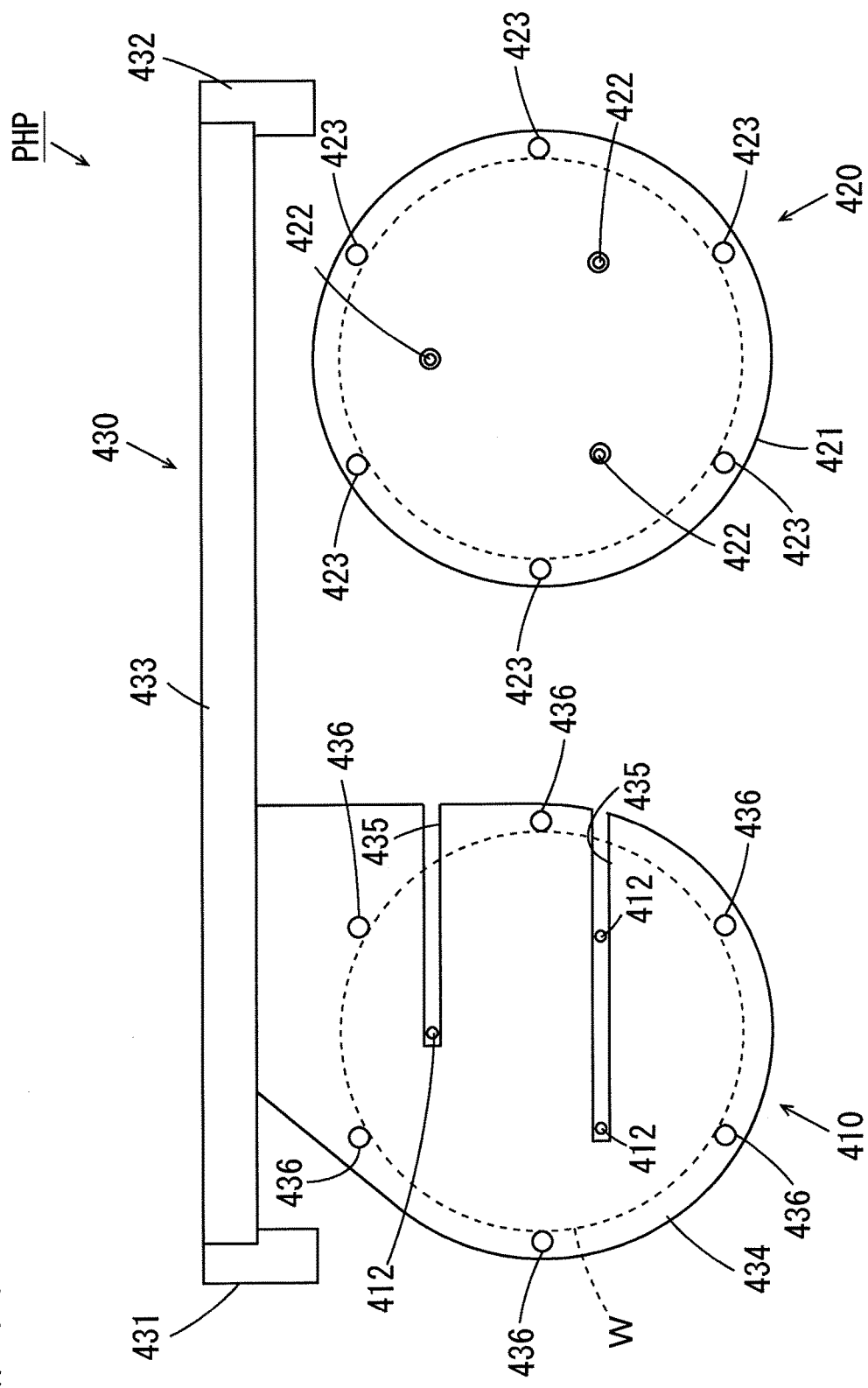
FIG. 14 is a plan view of the thermal processing unit of FIG. 13.
Figure 15:
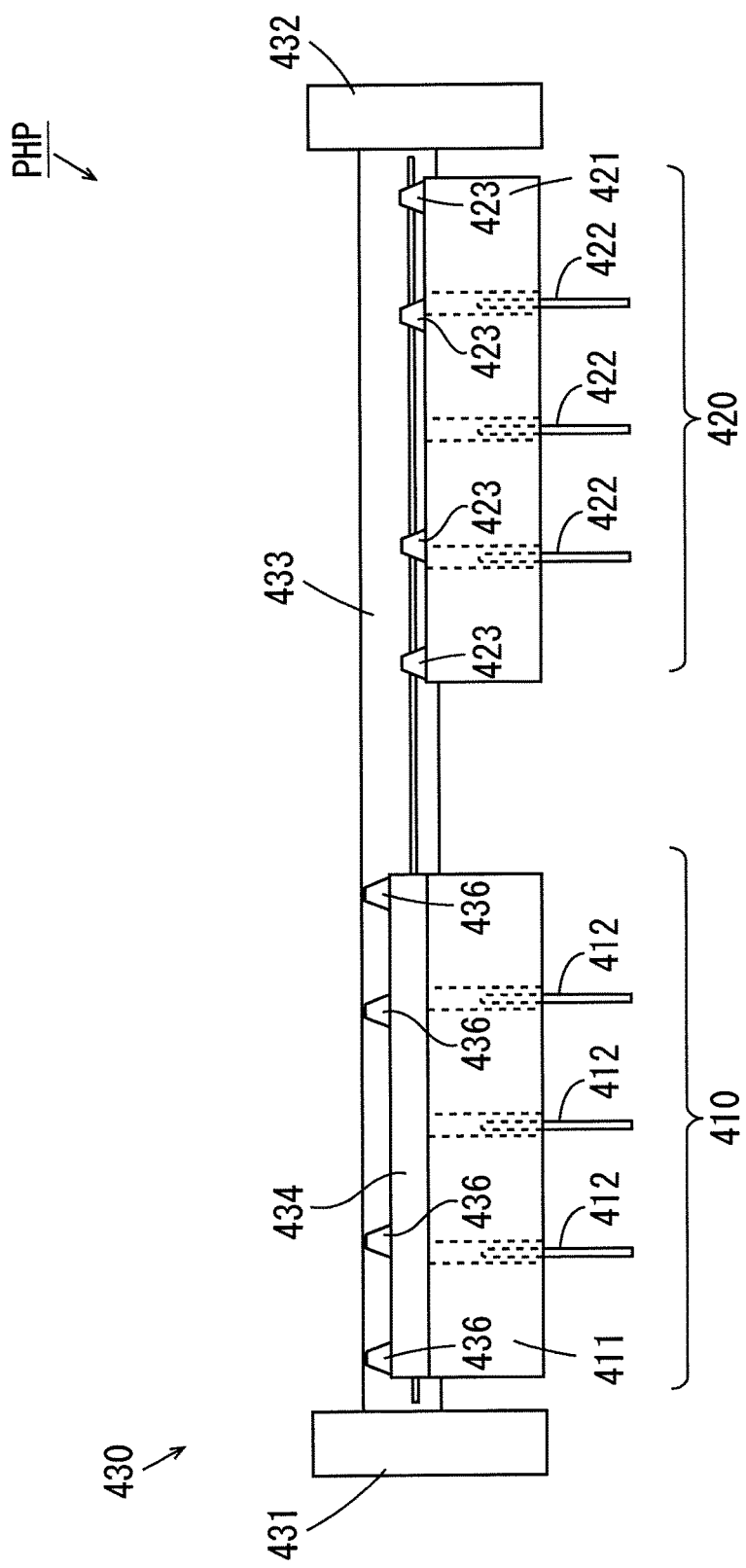
FIG. 15 is a side view of the thermal processing unit of FIG. 13.

(d) Cooling Units, Thermal Processing Units, Adhesion Reinforcement Processing Units or Placement Cooling Units FIG. 13 is a perspective view of the thermal processing unit PHP. FIG. 14 is a plan view of the thermal processing unit PHP of FIG. 13. FIG. 15 is a side view of the thermal processing unit PHP of FIG. 13. As shown in FIGS. 13, 14, the thermal processing unit PHP includes a cooler 410, a heater 420 and a transport mechanism 430. The cooler 410 and the heater 420 are arranged in alignment. The transport mechanism 430 is arranged to be capable of transporting the substrate W between the cooler 410 and the heater 420.

The cooler 410 includes a substrate platform plate 411, and a plurality (three in the present example) of support pins 412 that can be lifted and lowered. The substrate platform plate 411 is a cooling plate, for example. A plurality (three in the present example) of support pin insertion holes are formed in the substrate platform plate 411. A transport arm 434 of the below-mentioned transport mechanism 430 comes into contact with an upper surface of the substrate platform plate 411, whereby the substrate W held by the transport arm 434 can be cooled together with the transport arm 434.

The plurality of support pins 412 are arranged such that they can be respectively inserted into the plurality of support pin insertion holes of the substrate platform plate 411 by being moved in the vertical direction. During the carrying of the substrate W into and out from the cooler 410, upper ends of the plurality of support pins 412 are respectively moved between positions above the substrate platform plate 411 and positions below the upper surface of the substrate platform plate 411 through the plurality of support pin insertion holes.

The heater 420 includes a substrate platform plate 421, a plurality (three in the present example) of support pins 422 that can be lifted and lowered, and a plurality (six in the present example) of guide members 423. The substrate platform plate 421 is a hot plate that performs heating processing on the substrate W, for example. A plurality (three in the present example) of support pin insertion holes are formed in the substrate platform plate 421. The plurality of support pins 422 have the configuration similar to the plurality of support pins 412.

The plurality of guide members 423 are provided at substantially equal intervals along an edge of the substrate platform plate 421. In the present example, the six guide members 423 are provided at intervals of substantially 60°. As shown in FIG. 13, each guide member 423 has a truncated cone shape. When the substrate W is arranged in a region surrounded by the plurality of guide members 423, the substrate W is led downward along inclined side surfaces of the guide members 423. Thus, the center of the substrate platform plate 421 coincides with the center of the substrate W.

The transport mechanism 430 includes two elongated guide rails 431, 432 provided to extend in the vertical direction. The guide rails 431, 432 are arranged to be opposite to each other with the cooler 410 and the heater 420 sandwiched therebetween. The elongated guide rail 433 is provided between the guide rail 431 and the guide rail 432. The guide rail 433 is attached to the guide rails 431, 432 to be movable in the vertical direction. The transport arm 434 is attached to the guide rail 433. The transport arm 434 is provided to be movable in the longitudinal direction of the guide rail 433.

As shown in FIGS. 13 and 14, slits 435 are provided in the transport arm 434 such that the transport arm 434 does not interfere with the plurality of support pins 412 of the cooler 410 and the plurality of support pins 422 of the heater 420. Further, a plurality of guide members 436 are provided at the transport arm 434. The plurality of guide members 436 have the configuration similar to the plurality of guide members 423. During the substrate processing, the transport arm 434 transports the substrate W between the cooler 410 and the heater 420. In the present example, the transport arm 434 is the substrate supporter WS, and the plurality of guide members 436 are the guide mechanisms.

FIGS. 16A to 16E are diagrams for explaining the reference position when the substrate supporter WS is provided in the thermal processing unit PHP. Hereinafter, the reference position in a case in which the transport arm 434 of the thermal processing unit PHP is the substrate supporter WS will be explained. The reference position in the cooling unit CP, the adhesion reinforcement processing unit PAHP or the placement cooling platform P-CP is similar to the reference position in the thermal processing unit PHP.

Figure 16A:
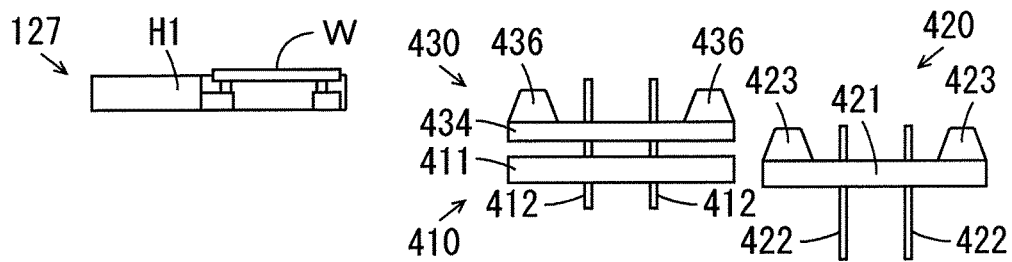
FIGS. 16A to 16E are diagrams for explaining the reference position when the substrate supporter is provided in the thermal processing unit.
Figure 16B:
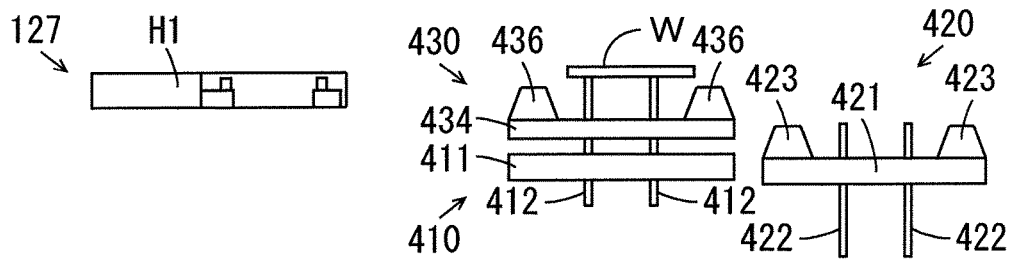

During the teaching operation, the plurality of support pins 412 of the cooler 410 are first lifted as shown in FIG. 16A. Next, as shown in FIG. 16B, the transport mechanism 127 holds the substrate W by the hand H1 and transports the substrate W to the upper ends of the plurality of lifted support pins 412. Thus, the substrate W is supported by the plurality of support pins 412 with its center being located at the tentative target position.

Figure 16C:
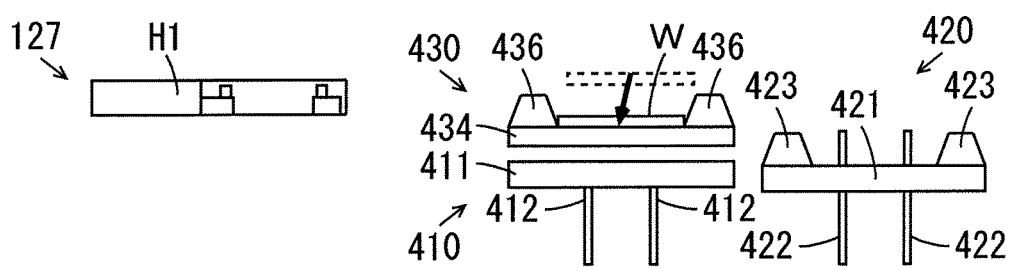

Thereafter, as shown in FIG. 16C, the plurality of support pins 412 are lowered. When the tentative target position does not coincide with the reference position, the substrate W is led downward along the inclined side surfaces of the plurality of guide members 436 on the transport arm 434 as indicated by the arrow in FIG. 16C. Thus, the center of the transport arm 434 coincides with the center of the substrate W.

Figure 16D:
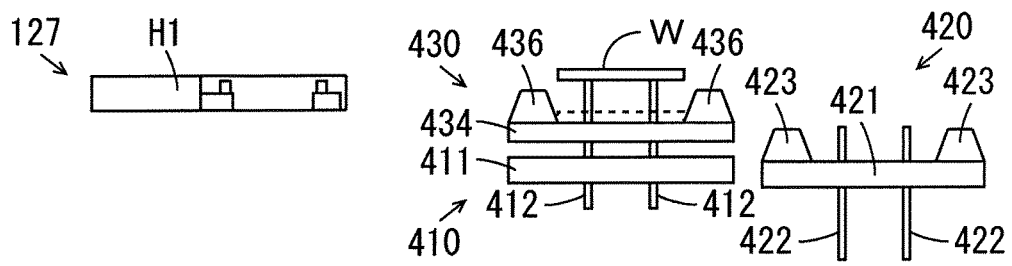
Figure 16E:
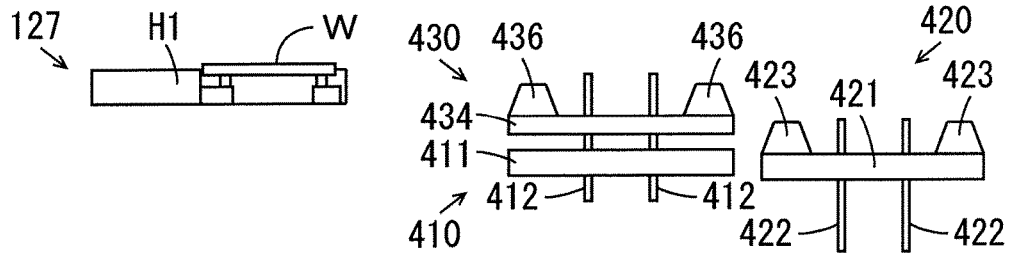

Next, as shown in FIG. 16D, the plurality of support pins 412 are lifted. Subsequently, as shown in FIG. 16E, the transport mechanism 127 receives the substrate W by the hand H1 from the plurality of support pins 412. In FIG. 16D, the position of the center of the substrate W supported by the plurality of support pins 412 is the reference position. That is, the position of the center of the substrate W led by the plurality of guide members 436 is the reference position.

(e) Cleaning Drying Processing Units

Figure 17A:
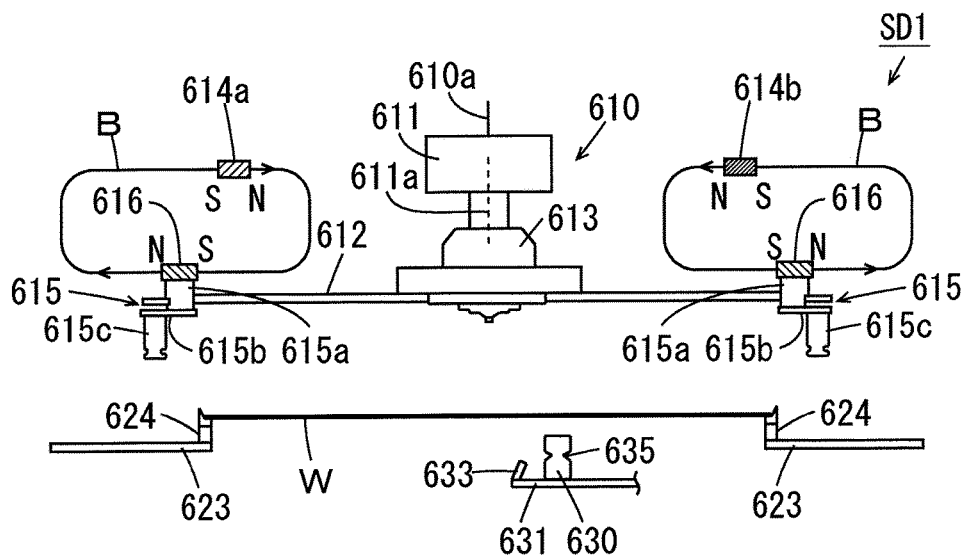
FIGS. 17A and 17B are diagrams showing a configuration of a cleaning drying processing unit.
Figure 17B:
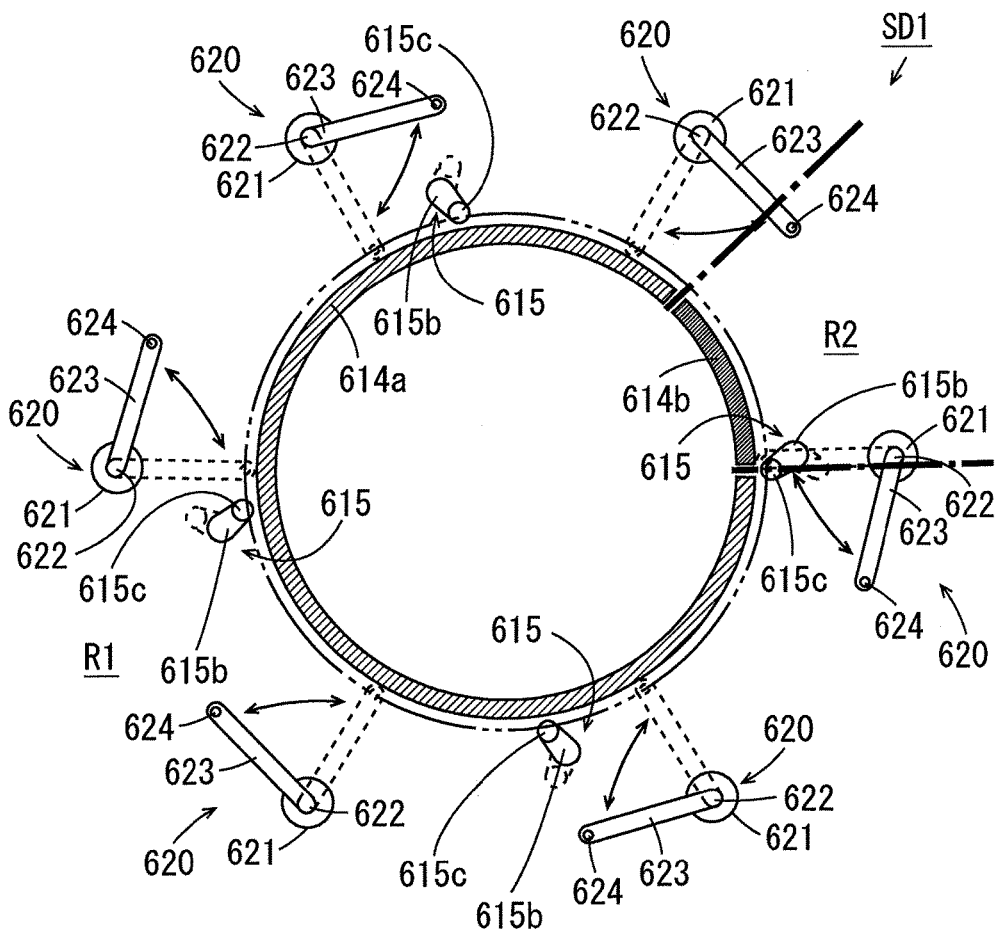

FIGS. 17A, 17B are diagrams showing the configuration of each of the cleaning drying processing units SD1. FIG. 17A, 17B show a side view and a plan view of the cleaning drying processing unit SD1, respectively. Each cleaning drying processing unit SD2 has the configuration similar to the cleaning drying processing unit SD1.

As shown in FIG. 17A, the cleaning drying processing unit SD1 includes a spin chuck 610 that horizontally holds the substrate W and rotates the substrate W about a rotation axis 611a in the vertical direction. The spin chuck 610 includes a spin motor 611, a disk-shape spin plate 612, a plate support member 613, magnet plates 614a, 614b and a plurality of chuck pins 615.

As shown in FIG. 17A, the plate support member 613 is attached to a lower end of a rotation shaft of the spin motor 611. The spin plate 612 is horizontally supported by the plate support member 613. The spin plate 612 is rotated about the rotation axis 611a in the vertical direction by the spin motor 611.

A liquid supply pipe 610a is inserted into the spin motor 611 and the plate support member 613. A cleaning liquid can be supplied to the upper surface of the substrate W held by the spin chuck 610 through the liquid supply pipe 610a. Pure water, for example, is used as the cleaning liquid.

More than three (four in the present example) chuck pins 615 are provided at the peripheral portion of the spin plate 612 about the rotation axis 611a at equal angular intervals. Each chuck pin 615 includes a shaft 615a, a pin supporter 615b, a holder 615c and a magnet 616. The shaft 615a is provided to penetrate the spin plate 612, and the pin supporter 615b extending in the horizontal direction is connected to a lower end of the shaft 615a. The holder 615c is provided to project downward from a tip end of the pin supporter 615b. Further, the magnet 616 is attached to an upper end of the shaft 615a above an upper surface of the spin plate 612.

Each chuck pin 615 is rotatable about a vertical axis by being centered at the shaft 615a and can be switched between a close state in which the holder 615c abuts against the outer peripheral end of the substrate W and an open state in which the holder 615c is spaced apart from the outer peripheral end of the substrate W. In the present example, when an N pole of the magnet 616 is on an inner side, each chuck pin 615 enters the close state, and when an S pole of the magnet 616 is on the inner side, each chuck pin 615 enters the open state.

The magnet plates 614a, 614b are arranged above the spin plate 612 in a circumferential direction centered at the rotation shaft 611a. The magnet plates 614a, 614b have S poles on the outer side and N poles on the inner side. The magnet plates 614a, 614b are respectively independently lifted and lowered by a magnet lifting lowering mechanism (not shown) and are moved between an upper position that is higher than the magnet 616 of the chuck pin 615 and a lower position that is substantially the same height as the magnet 616 of the chuck pin 615. Each chuck pin 615 is switched between the open state and the close state by the lifting and lowering of the magnet plates 614a, 614b as described below.

As shown in FIG. 17A, a cleaning brush 630 for cleaning the outer peripheral end and the back surface of the substrate W held by the spin chuck 610 is provided in a lower portion of the cleaning drying processing unit SD1. The cleaning brush 630 is substantially columnar, and a groove 635 having a V-shape cross section is formed at an outer peripheral surface. The cleaning brush 630 is held by a brush holding member 631. The brush holding member 631 is driven by a brush moving mechanism (not shown), so that the cleaning brush 630 is moved in the horizontal and vertical directions.

A cleaning nozzle 633 is attached to a portion of the brush holding member 631 in the vicinity of the cleaning brush 630. A liquid supply pipe (not shown) to which the cleaning liquid is supplied is connected to the cleaning nozzle 633. A discharge port of the cleaning nozzle 633 is directed to a periphery of the cleaning brush 630, and the cleaning liquid is discharged towards the periphery of the cleaning brush 630 from the discharge port.

As shown in FIG. 17B, more than two (six in the present example) substrate receiving transferring mechanisms 620 are arranged at equal angular intervals about the rotation axis 611a of the spin chuck 610. Each substrate receiving transferring mechanism 620 includes a lifting lowering rotation driver 621, a rotation shaft 622, an arm 623 and a holding pin 624. The rotation shaft 622 is provided to extend upward from the lifting lowering rotation driver 621, and the arm 623 is coupled to an upper end of the rotation shaft 622 to extend in the horizontal direction. The holding pin 624 for holding the outer peripheral end of the substrate W is provided at a tip end of the arm 623.

As shown in FIG. 17A, an inner surface at a tip end of each holding pin 624 has an inclined portion. The rotation shaft 622 performs a lifting lowering operation and a rotating operation by the lifting lowering rotation driver 621. Thus, the holding pin 624 is moved in the horizontal and vertical directions. In the present example, the holding pin 624 is the substrate supporter WS, and the inclined portion of the holding pin 624 is the guide mechanism.

Next, the operation of the cleaning drying processing unit SD1 will be described with reference to FIGS. 17A to 18D. FIGS. 18A to 18D are schematic diagrams for explaining the operation of the cleaning drying processing unit SD1. First, as shown in FIG. 17A, the substrate W is placed on the plurality of holding pins 624 by the transport mechanism 141 of FIG. 1.

At this time, the magnet plates 614a, 614b are at the upper positions. In this case, lines of magnetic force B of the magnet plates 614a, 614b are directed outward at the height of the magnets 616 of the chuck pins 615. Thus, the S pole of the magnet 616 of each chuck pin 615 is attracted inward. Therefore, each chuck pin 615 enters the open state. Subsequently, the plurality of holding pins 624 are lifted while holding the substrate W. Thus, the substrate W is moved to a position among the holders 615c of the plurality of chuck pins 615.

Figure 18A:
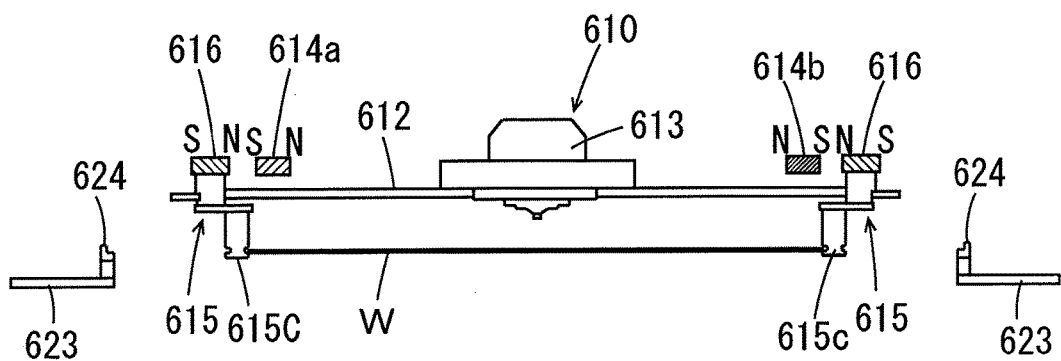
FIGS. 18A to 18D are schematic diagrams for explaining an operation of the cleaning drying processing unit.

Then, as shown in FIG. 18A, the magnet plates 614a, 614b are moved to the lower positions. In this case, the N pole of the magnet 616 of each chuck pin 615 is attracted inward. Thus, each chuck pin 615 enters the close state, and the outer peripheral end of the substrate W is held by the holder 615c of each chuck pin 615. Thereafter, the plurality of holding pins 624 are moved outward of a guard 618.

Figure 18B:
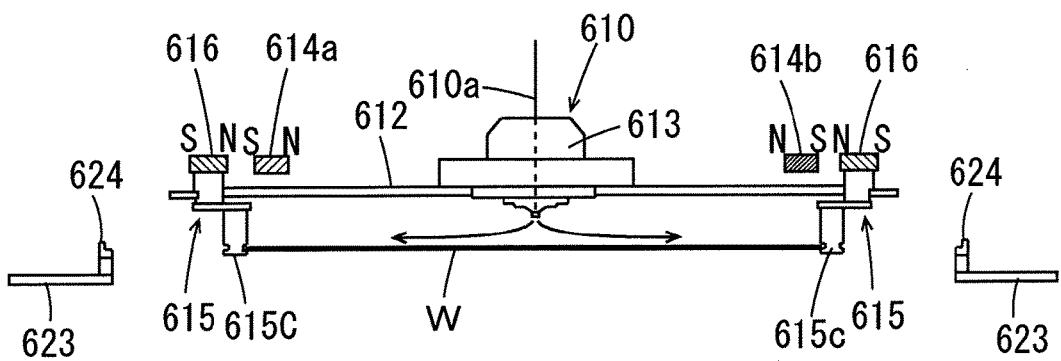

As shown in FIG. 18B, during surface cleaning processing for the substrate W, with the substrate W being rotated by the spin chuck 610, the cleaning liquid is supplied to a surface of the substrate W through the liquid supply pipe 610a. The cleaning liquid spreads across the surface of the substrate W by centrifugal force and is splashed outward. Thus, particles or the like adhering to the surface of the substrate W are cleaned away. Further, part of a component of the film such as the resist film on the substrate W is eluted in the cleaning liquid and cleaned away.

Figure 18C:
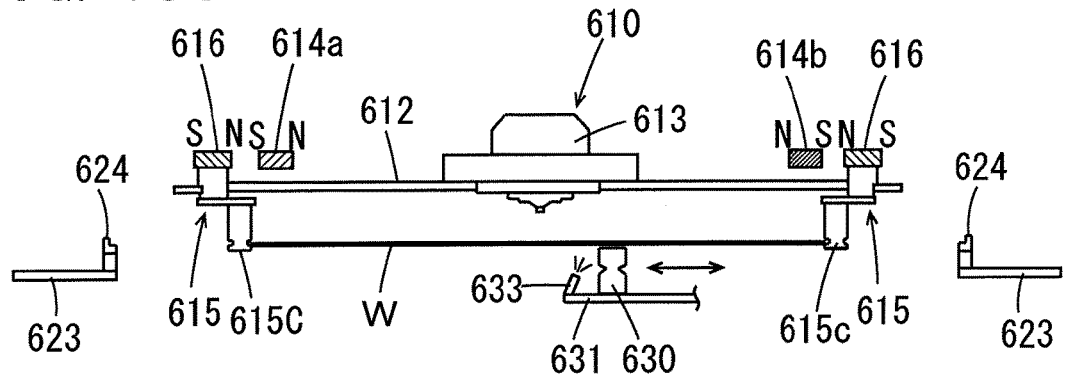

As shown in FIG. 18C, during back surface cleaning processing for the substrate W, with the substrate W being rotated by the spin chuck 610, the cleaning brush 630 is moved to a position below the substrate W. Then, with an upper surface of the cleaning brush 630 being in contact with the back surface of the substrate W, the cleaning brush 630 is moved between a position below the center portion and a position below the peripheral portion of the substrate W. The cleaning liquid is supplied from the cleaning nozzle 633 to a contact portion of the substrate W with the cleaning brush 630. Thus, the entire back surface of the substrate W is cleaned by the cleaning brush 630, and contaminants adhering to the back surface of the substrate W are removed.

Figure 18D:
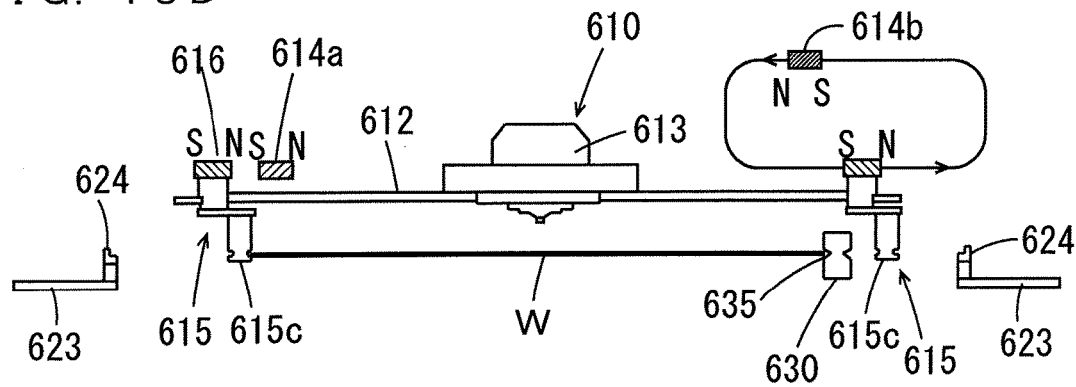

As shown in FIG. 18D, during end cleaning processing for the substrate W, the magnet plate 614a is arranged at the lower position, and the magnet plate 614b is arranged at the upper position. In this state, the substrate W is rotated by the spin chuck 610.

In this case, each chuck pin 615 enters the close state in an outer region R1 of the magnetic plate 614a (see FIG. 17B), and each chuck pin 615 enters the open state in an outer region R2 of the magnetic plate 614b (See FIG. 17B). That is, the holder 615c of each chuck pin 615 is kept being in contact with the outer peripheral end of the substrate W when passing through the outer region R1 of the magnetic plate 614a and is spaced apart from the outer peripheral end of the substrate W when passing through the outer region R2 of the magnetic plate 614b.

The cleaning brush 630 is moved to a position between the holder 615c of the chuck pin 615 and the outer peripheral end of the substrate W in the outer region R2. Then, the groove 635 of the cleaning brush 630 is pressed against the outer peripheral end of the substrate W. The cleaning liquid is supplied from the cleaning nozzle 633 (FIG. 18C) to a contact portion of the cleaning brush 630 with the substrate W. Thus, the entire outer peripheral end of the substrate W is cleaned, and contaminants adhering to the outer peripheral end of the substrate W are removed.

Drying processing for the substrate W is performed after the above-mentioned surface cleaning processing, back surface cleaning processing and end cleaning processing. In this case, the magnet plates 614a, 615b are arranged at the lower positions, and the substrate W is held by all of the chuck pins 615. In this state, the substrate W is rotated at a high speed by the spin chuck 610. Thus, the cleaning liquid adhering to the substrate W is shaken off, so that the substrate W is dried.

FIGS. 19A to 19D are diagrams for explaining the reference position when the substrate supporter WS is provided in the cleaning drying processing unit SD1. The reference position in a case in which the holding pins 624 of the cleaning drying processing unit SD1 are the substrate supporter WS will be described below. The reference position in the cleaning drying processing unit SD2 is similar to the reference position in the cleaning drying processing unit SD1.

Figure 19A:
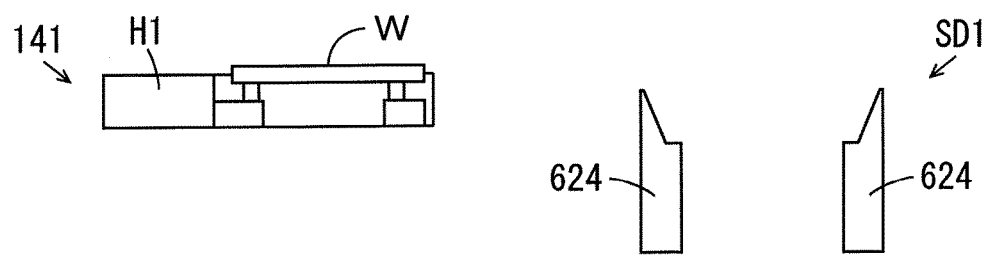
FIGS. 19A to 19D are diagrams for explaining the reference position when the substrate supporter is provided in the cleaning drying processing unit.

As shown in FIG. 19A, during the teaching operation, the transport mechanism 141 first holds the substrate W by the hand H1 and transports the substrate W to a position above the plurality of holding pins 624 of the cleaning drying processing unit SD1. Thus, the substrate W is held by the hand H1 with its center coinciding with the tentative target position above the plurality of holding pins 624.

Figure 19B:
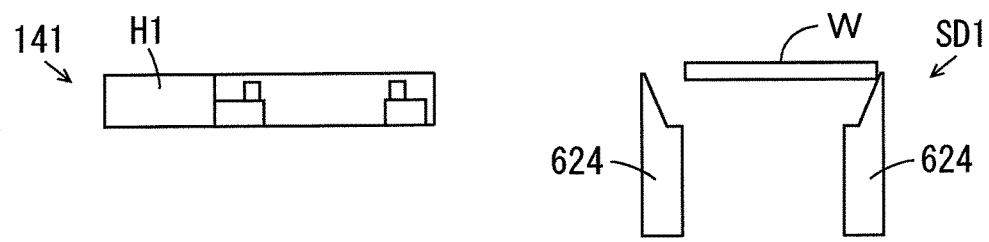

Next, as shown in FIG. 19B, the plurality of holding pins 624 are lifted. When the tentative target position does not coincide with the reference position, the substrate W is led to the center of the plurality of holding pins 624 along the inclined side surfaces of the plurality of holding pins 624 as indicated by an arrow in FIG. 19C. Thus, the center of the plurality of holding pins 624 coincides with the center of the substrate W.

Figure 19C:
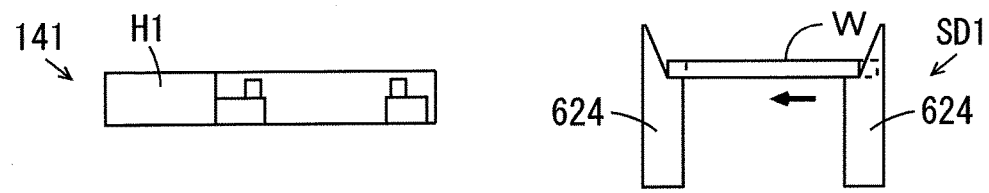
Figure 19D:
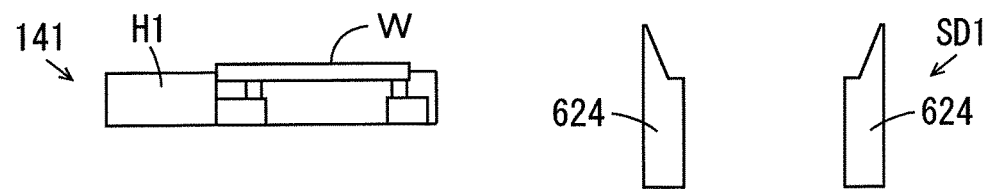

Then, as shown in FIG. 19D, the transport mechanism 141 receives the substrate W from the plurality of holding pins 624 by the hand H1. In FIG. 19C, the position of the center of the substrate W supported by the plurality of holding pins 624 is the reference position. That is, the position of the center of the substrate W led by the plurality of holding pins 624 is the reference position.

(10) Teaching Operation in Spin Chuck

When the spin chuck 25, 35, 98 is the substrate supporter WS, in a case in which the position of the rotational center of the spin chuck 25, 35, 98 is known, the teaching operation in the horizontal direction may be performed with the position of the rotational center being used as the reference position. On the other hand, when the position of the rotational center of the spin chuck 25, 35, 98 is not known, the teaching operation in the horizontal direction may be performed according to the following steps.

FIGS. 20A to 20D are diagrams for explaining the teaching operation in the horizontal direction when the substrate supporter WS is the spin chuck 25, 35, 98. FIGS. 20A to 20D show schematic plan views of the transport mechanism 127 and the spin chuck 25. In the example of FIGS. 20A to 20D, the substrate supporter WS is the spin chuck 25. The teaching operation in the spin chuck 35, 98 is similar to the teaching operation in the spin chuck 25.

Figure 20A:
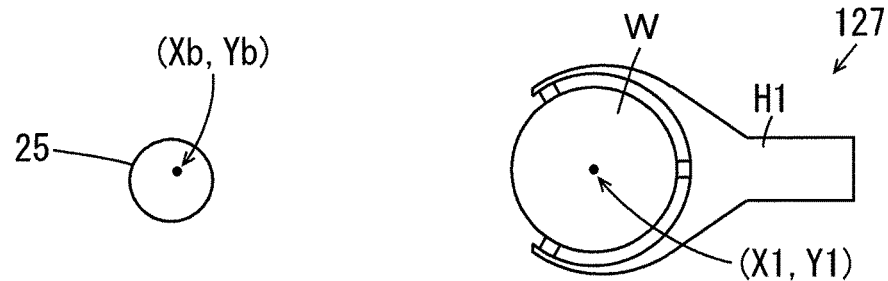
FIGS. 20A to 20D are diagrams for explaining the teaching operation in the horizontal direction when the substrate supporter is a spin chuck.
Figure 20B:
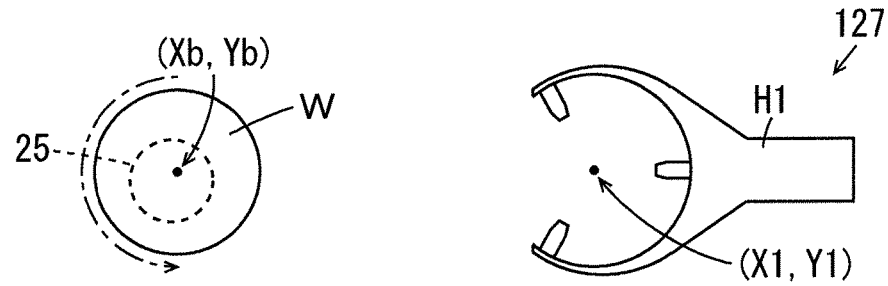
Figure 20C:
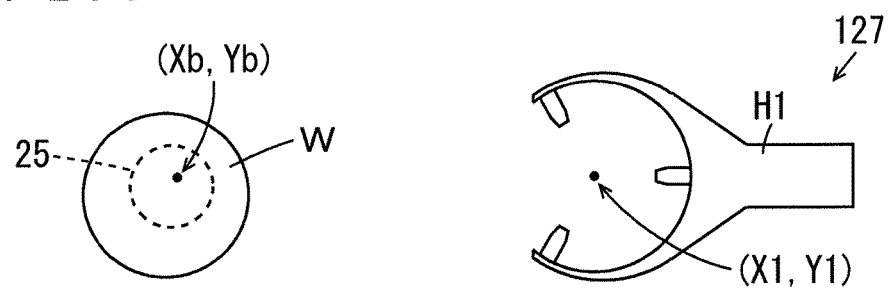

First, as shown in FIG. 20A, the transport mechanism 127 holds the substrate W at the normal position by the hand H1. The coordinates of the center of the substrate W are calculated. The calculated coordinates of the center of the substrate W are (X1, Y1). Next, as shown in FIG. 20B, the transport mechanism 127 transports the substrate W to the spin chuck 25. The spin chuck 25 holds the substrate W such that the center of the substrate W coincides with the tentative target position. Subsequently, as shown in FIG. 20C, the spin chuck 25 rotates the substrate W by a predetermined angle. The rotation angle of the substrate W by the spin chuck 25 is preferably 180°.

Figure 20D:
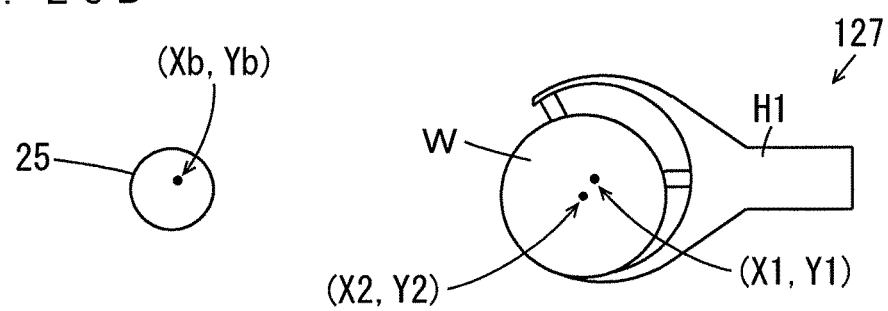

Thereafter, as shown in FIG. 20D, the transport mechanism 127 receives the substrate W from the spin chuck 25. The coordinates of the center of the substrate W are calculated. The calculated coordinates of the center of the substrate W are (X2, Y2). Next, deviations ($\Delta X$, $\Delta Y$) of the reference position coordinates from the tentative target position coordinates are calculated based on the calculated coordinates (X1, Y1) and coordinates (X2, Y2). In the processing of FIGS. 20B, 20C, when the rotation angle of the substrate W is 180°, the deviations ($\Delta X$, $\Delta Y$) of the reference position coordinates from the tentative target position coordinates are supplied by the following formulas (5), (6).

$$\Delta X = (X1+X2)/2 \quad (5)$$

$$\Delta Y = (Y1+Y2)/2 \quad (6)$$

Next, the true target position coordinates (Xrb, Yrb) are calculated. The true target position Xrb in the X direction is supplied by the following formula (7). When X1<X2, a positive sign is applied, and when X1>X2, a negative sign is applied. Further, the true target position Yrb in the Y direction is supplied by the following formula (8). When Y1<Y2, the positive sign is applied, and when Y1>Y2, the negative sign is applied. The calculated true target position coordinates (Xrb, Yrb) are stored in the memory 520 of the controller 500 as the correction information.

$$Xrb = Xb \pm \Delta X \quad (7)$$

$$Yrb = Yb \pm \Delta Y \quad (8)$$

While the teaching operation using the hand H1 of the transport mechanism 127 is described in the above-mentioned example, the teaching operation using the hand H2 is similar to the operation using the hand H1. Further, the teaching operation using the transport mechanism 127, 137, 138 is similar to the teaching operation using the transport mechanism 127.

(11) One Control Example of Transport Mechanisms

In the transport mechanism 127, the outer periphery of the substrate W held by the hand H1 is detected by the sensor device 316. Further, the outer periphery of the substrate W held by the hand H2 is detected by the sensor device 316.

FIG. 21A to FIG. 22C are diagrams showing one control example of the transport mechanism 127 for detecting the outer peripheries of the two substrates W held by the two hands H1, H2 by the one sensor device 316. In each of FIGS. 21A to 21E and FIGS. 22A to 22C, a positional relationship between the hands H1, H2 and the one detector 316D is shown in a longitudinal cross sectional view.

In an initial state, the substrate W is not held by each of the hands H1, H2. Further, the hands H1, H2 are at the advancing retreating reference position FBP. In this case, each light receiver 316r receives the light emitted from each light emitter 316t and passing through the inside of the guide portion Ha of the hand H1, H2 (see FIGS. 6A, 6B).

Figure 21A:
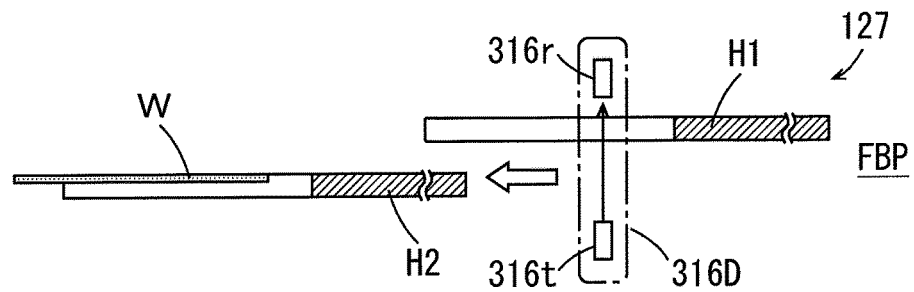
FIGS. 21A to 21E are diagrams showing one control example of the transport mechanism for detecting outer peripheries of two substrates held by two hands by one sensor device.

As shown in FIG. 21A, the lower hand H2 advances to a position in front of the detector 316D from the advancing retreating reference position FBP and receives the substrate W arranged at a predetermined position. At this time, the light receiver 316r receives the light emitted from the light emitter 316t.

Figure 21B:
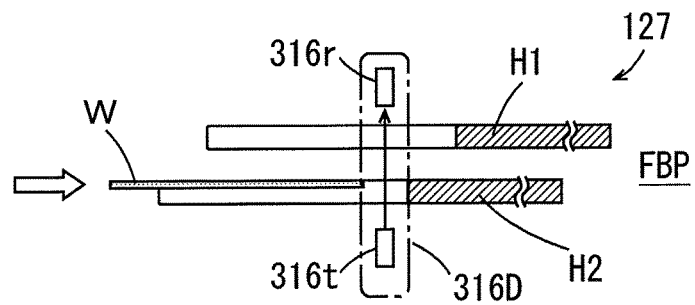
Figure 21C:
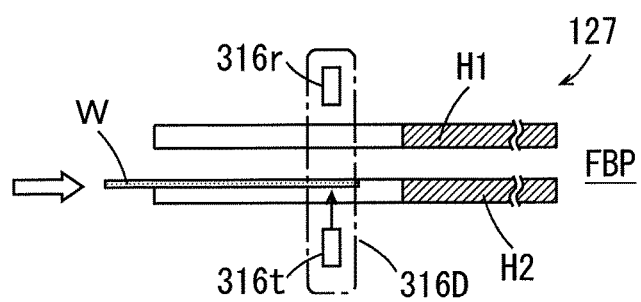

Next, the hand H2 holding the substrate W retreats towards the advancing retreating reference position FBP. In this case, as shown in FIG. 21B, the light receiver 316r receives the light emitted from the light emitter 316t and passing through a space between the outer periphery of the substrate W and the hand H2 until the hand H2 is moved to the advancing retreating reference position FBP. Thereafter, when the hand H2 reaches the advancing retreating reference position FBP, the substrate W held by the hand H2 is positioned between the light emitter 316t and the light receiver 316r. Thus, as shown in FIG. 21C, the light receiver 316r does not receive the light from the corresponding light emitter 316t.

The hand H2 is moved as described above. Thus, the plurality of portions at the outer periphery of the substrate W held by the hand H2 are detected based on the light reception signal output from the light receiver 316r.

Figure 21D:
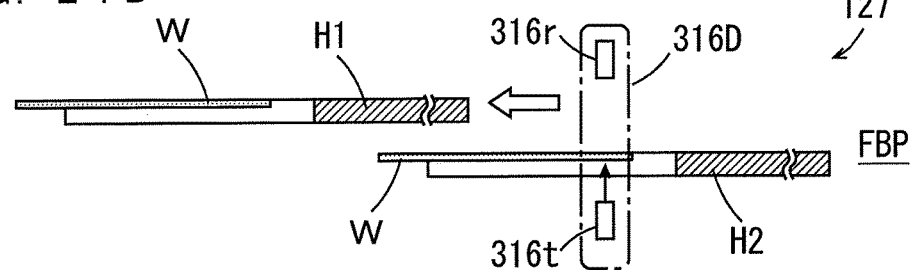

Subsequently, as shown in FIG. 21D, the upper hand H1 advances to a position in front of the detector 316D from the advancing retreating reference position FBP and receives the substrate W arranged at a predetermined position. At this time, the light emitted from the light emitter 316t is shielded by the substrate W held by the hand H2. Therefore, the light receiver 316r does not receive the light emitted from the light emitter 316t.

Figure 21E:
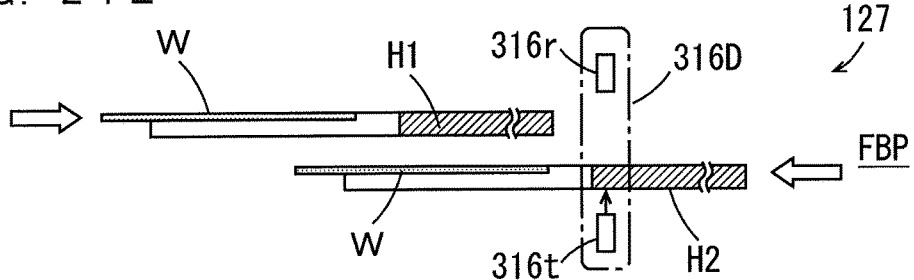
Figure 22A:
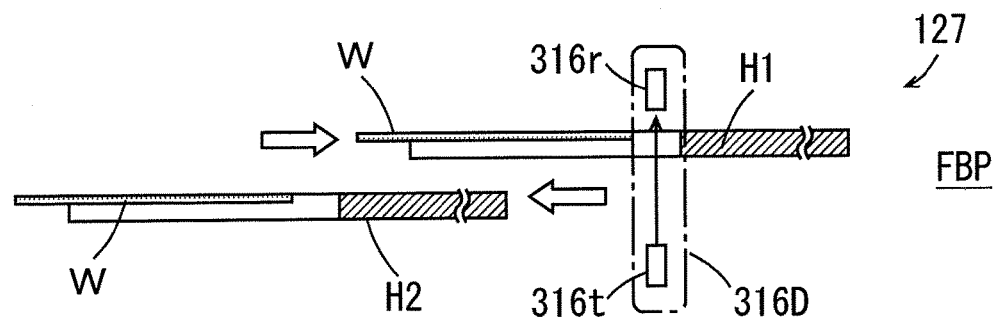
FIGS. 22A to 22C are diagrams showing one control example of the transport mechanism for detecting the outer peripheries of the two substrates held by the two hands by the one sensor device.

Next, as shown in FIG. 21E, the hand H1 holding the substrate W retreats towards the advancing retreating reference position FBP, and the hand H2 holding the substrate W advances from the advancing retreating reference position FBP. Thereafter, as shown in FIG. 22A, the hand H2 is moved to a position further forward than the light emitter 316t and the light receiver 316r. In this manner, the light receiver 316r receives the light emitted from the light emitter 316t and passing through a space between the outer periphery of the substrate W and the hand H2 until the hand H1 is moved to the advancing retreating reference position FBP.

Figure 22B:
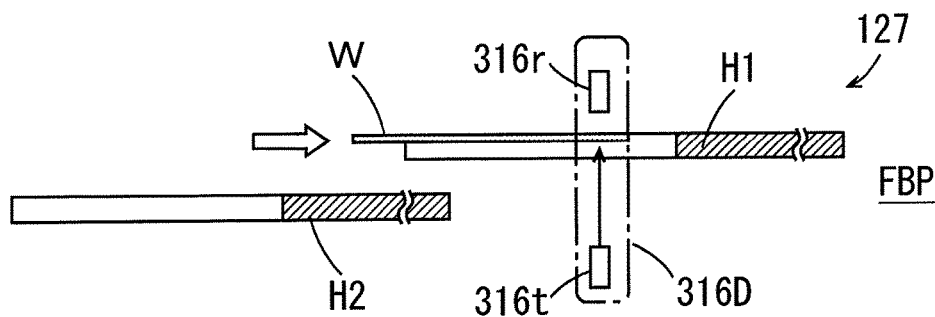

When the hand H1 is moved to the advancing retreating reference position FBP, the substrate W held by the hand H1 is positioned between the light emitter 316t and the light receiver 316r. Thus, as shown in FIG. 22B, the light receiver 316r does not receive the light from the corresponding light emitter 316t.

The hands H1, H2 are moved as described above. Thus, the plurality of portions at the outer periphery of the substrate W held by the hand H1 are detected based on the light reception signals output from the light receivers 316r.

Figure 22C:
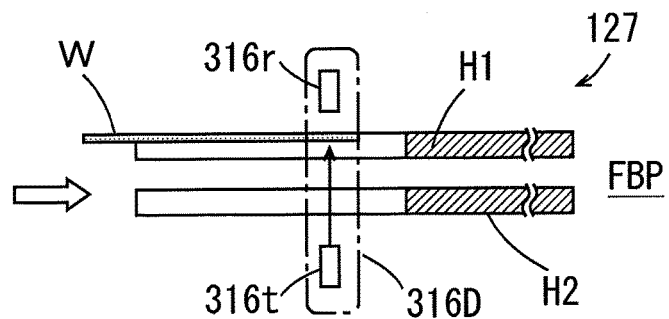

Thereafter, as shown in FIG. 22C, the hand H2 retreats to the advancing retreating reference position FBP after the substrate W held by the advancing hand H2 is placed on any one of the substrate supporters WS.

As described above, in the present embodiment, the hands H1, H2 perform an advancing retreating operation in the opposite directions to each other, so that the plurality of portions at the outer peripheries of the two substrates W held by the two hands H1, H2 can be detected by the one sensor device 316.

(12) Effects

In the present embodiment, during the teaching operation in the horizontal direction regarding the transport mechanism 127 and the like, the hand H1 is moved to the tentative target position in the substrate supporter WS except for the spin chuck 25 and the like, and the substrate W supported at the reference position in the substrate supporter WS is received by the hand H1. The positional relationship between the substrate W held by the hand H1 and the hand H1 is detected. The deviation between the tentative target position and the reference position is acquired as the correction information based on the detected positional relationship.

Alternatively, the hand H1 is moved to the tentative target position in the substrate supporter WS such as the spin chuck 25, and the substrate W is transferred to the substrate supporter WS. The substrate W supported in a horizontal attitude by the substrate supporter WS is rotated about the reference position by the predetermined angle. The hand H1 is moved to the tentative target position in the substrate supporter WS, and the substrate W supported by the substrate supporter WS is received. The deviation between the tentative target position and the reference position is acquired as the correction information based on the positional relationship between the hand H1 and the substrate W before the substrate W is transferred to the substrate supporter WS and the positional relationship between the hand H1 and the substrate W after the substrate W is received from the substrate supporter WS.

During the teaching operation or during the substrate processing, the tentative target position is corrected to the true target position to coincide with the reference position based on the acquired correction information. During the substrate processing, the hand H1 is moved to the true target position, so that the substrate W is transferred to the substrate supporter WS by the hand H1 or the substrate W is received from the substrate supporter WS by the hand H1. Thus, the substrate W can be transferred to the substrate supporter WS by the hand H1 to be supported at the reference position, or the hand H1 can be moved to the substrate supporter WS to receive the substrate W supported at the reference position.

Further, during the teaching operation in the vertical direction regarding the transport mechanism 127 and the like, the hand H1 is lifted from below the substrate W supported at the reference height by the substrate supporter WS. It is detected that the hand H1 has held the lower surface of the substrate W. The target height in the vertical direction is determined based on the position of the hand H1 in the vertical direction at the detection time point. When the hand H1 is moved to the substrate supporter WS during the substrate processing, the hand H1 is moved to the determined target height, whereby the substrate W is transferred to the substrate supporter WS or the substrate W is received from the substrate supporter WS. Thus, the substrate W can be transferred to the substrate supporter WS by the hand H1 to be supported at the reference height, or the hand H1 can be moved to the substrate supporter WS to receive the substrate W supported at the reference height.

This configuration causes the hand H1, H2 to receive the substrate W supported at the reference position by the substrate supporter WS, so that the teaching operation regarding the transport mechanism 115, 127, 128, 137, 138, 141, 142, 146 is performed. Thus, a burden on an operator due to the teaching regarding the transport mechanism 115, 127, 128, 137, 138, 141, 142, 146 is reduced. In this case, it is not necessary to prepare a dedicated jig in order to perform the teaching regarding the transport mechanism 115, 127, 128, 137, 138, 141, 142, 146. Therefore, a burden on the operator due to maintenance and management of the jig does not occur, and a cost resulting from the purchase of the jig and the maintenance and management of the jig does not occur either. As a result, the teaching regarding the transport mechanism 115, 127, 128, 137, 138, 141, 142, 146 can be performed at a low cost while a burden on the operator is reduced.

(13) Other Embodiments (a) While the correction information regarding each hand H1, H2 is independently acquired by the above-mentioned method in the above-mentioned embodiment, the invention is not limited to this. The correction information regarding the one hand may be acquired by the above-mentioned method, and the correction information regarding another hand may be acquired based on the correction information regarding the one hand.

Figure 23A:
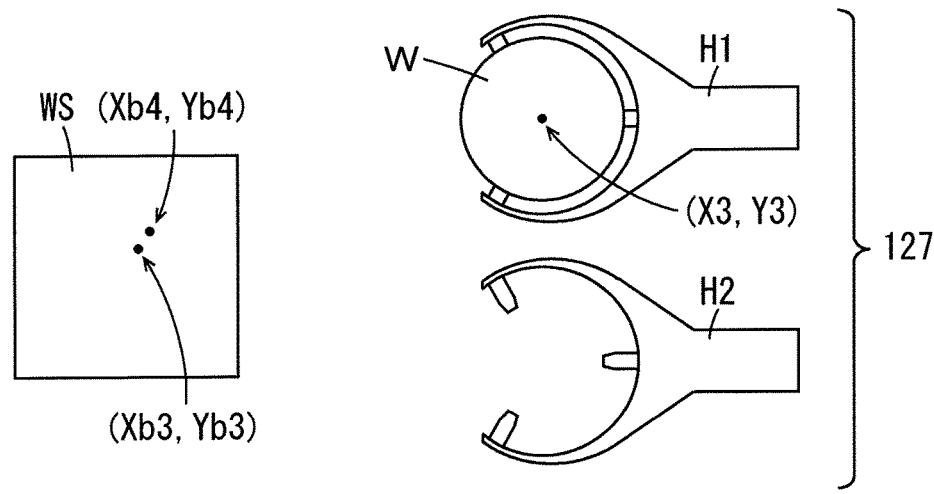
FIGS. 23A to 23C are diagrams for explaining a teaching operation of another hand in another embodiment.
Figure 23B:
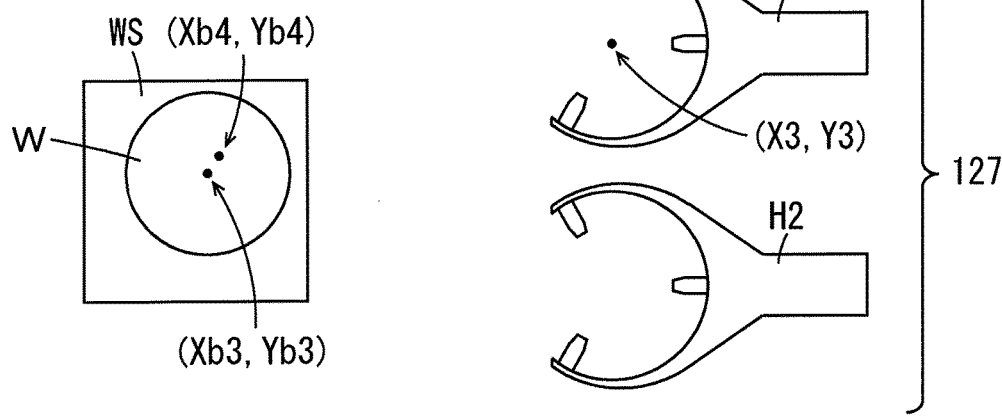
Figure 23C:
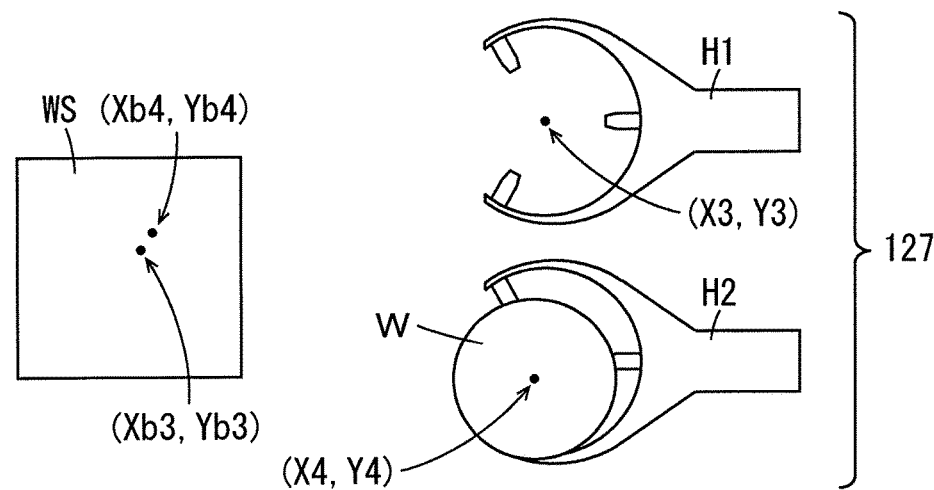

FIGS. 23A to 23C are diagrams for explaining steps for acquiring the correction information of the other hand in another embodiment. FIGS. 23A to 23C show schematic plan views of the transport mechanism 127 and the substrate supporter WS. While the hands H1, H2 are provided to overlap with each other in the vertical direction, the hands H1, H2 are shown to be arranged in the horizontal direction in the example of FIGS. 23A to 23C in order to facilitate understanding. In the example of FIGS. 23A to 23C, it is considered that the correction information regarding hand H2 is acquired based on the correction information regarding the hand H1.

First, as shown in FIG. 23A, the transport mechanism 127 holds the substrate W at the normal position by the hand H1. The coordinates of the center of the substrate W in the hand H1 are calculated. The calculated coordinates of the center of the substrate W in the hand H1 are (X3, Y3). Next, as shown in FIG. 23B, the hand H1 transports the substrate W to the substrate supporter WS. The substrate supporter WS holds the substrate W with the center of the substrate W coinciding with the tentative target position. The tentative target position coordinates in the substrate supporter WS corresponding to the hand H1 are (Xb3, Yb3).

Thereafter, as shown in FIG. 23C, the hand H2 takes out the substrate W from the substrate supporter WS. The tentative target position coordinates in the substrate supporter WS corresponding to the hand H2 are (Xb4, Yb4). Because the tentative target position corresponding to the hand H1 is different from the tentative target position corresponding to the hand H2, the hand H2 holds the substrate W at a position different from the normal position in FIG. 23C. The coordinates of the center of the substrate W in the hand H2 are calculated. The calculated coordinates of the center of the substrate W in the hand H2 are (X4, Y4).

The controller 500 calculates the deviations between the coordinates (X3, Y3) of the center of the substrate W in the hand H1 and the coordinates (X4, Y4) of the center of the substrate W in the hand H2. Further, the controller 500 calculates the correction information regarding the hand H2 based on the calculated deviations and the correction information regarding the hand H1. The correction information regarding the hand H2 is stored in the memory 520 of the controller 500.

The controller 500 determines the target height of the hand H2 based on the deviation between the reference heights of the hands H1, H2 and the target height of the hand H1 according to the similar steps. The Z coordinate of the determined target height is stored in the memory 520 of the controller 500.

Figure 24:
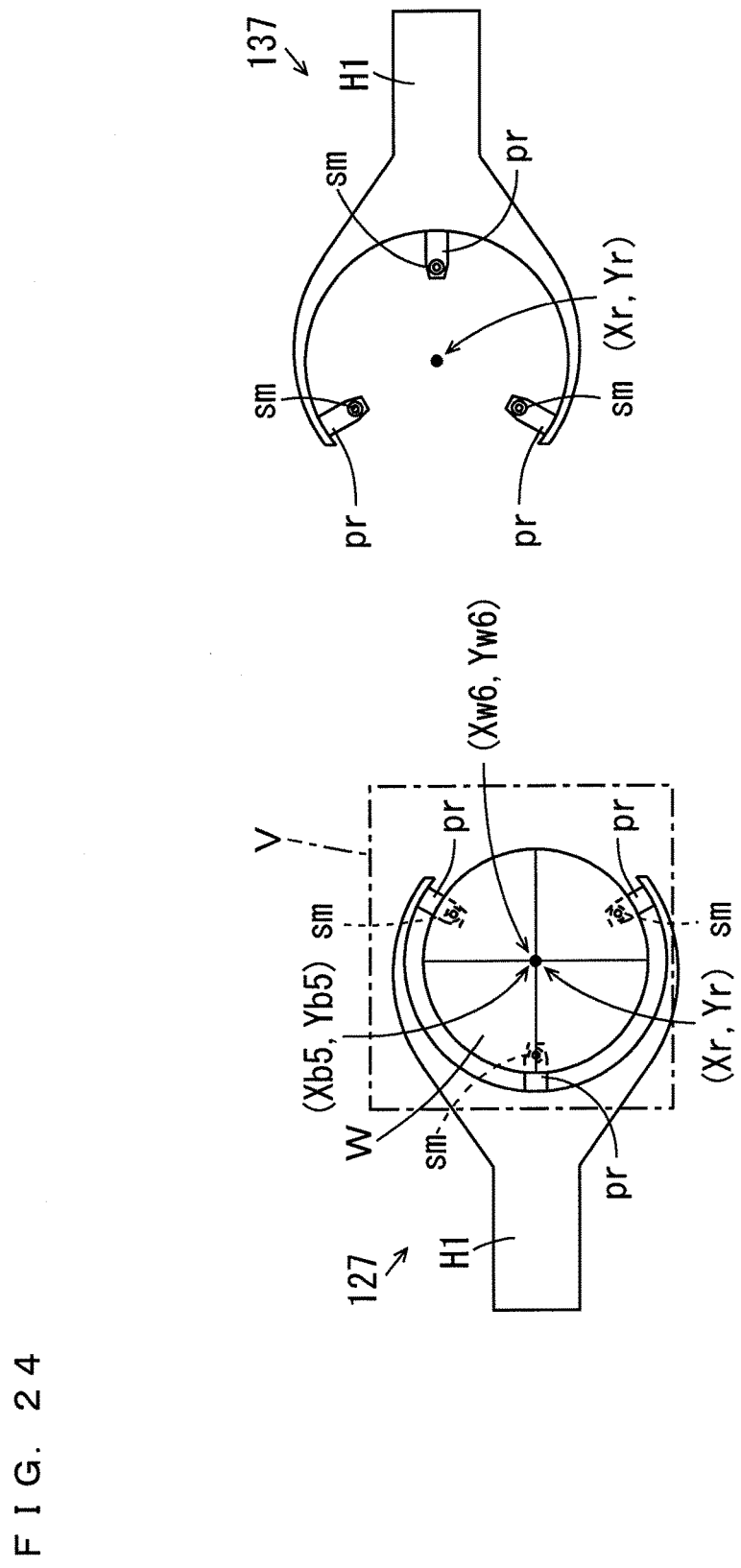
FIG. 24 is a diagram for explaining the reference position when receiving and transferring of the substrate are directly performed between the transport mechanisms.

(b) While the receiving and transferring of the substrates W among the transport mechanisms 115, 127, 128, 137, 138, 141, 142, 146 are performed via the substrate platforms PASS1 to PASS9 in the above-mentioned embodiment, the invention is not limited to this. The receiving and transferring of the substrates W among the transport mechanisms 115, 127, 128, 137, 138, 141, 142, 146 may be directly performed not via the substrate platforms. FIG. 24 is a diagram for explaining the reference position when the receiving and transferring of the substrate W are directly performed between the transport mechanisms. FIG. 24 shows a schematic plan view of the transport mechanisms 127, 137. It is considered that the substrate W is received and transferred from the transport mechanism 127 to the transport mechanism 137.

As shown in FIG. 24, the transport mechanism 127 transports the substrate W to a region V in which the receiving and transferring are to be performed by the hand H1 (hereinafter referred to as a receiving transferring region). Thereafter, the transport mechanism 127 waits with the center of the substrate W coinciding with the tentative target position in the receiving transferring region V until the substrate W is received and transferred to the transport mechanism 137.

The tentative target position coordinates in the receiving transferring region V corresponding to the transport mechanism 127 are (Xb5, Yb5). In this case, it is considered that the tentative target position coordinates (Xb5, Yb5) are the reference position coordinates (Xw6, Yw6) in the receiving transferring region V corresponding to the transport mechanism 137. That is, it is considered that the tentative target position in the receiving transferring region V corresponding to the transport mechanism 127 is the reference position in the receiving transferring region V corresponding to the transport mechanism 137.

(c) In the above-mentioned embodiment, the position of the center of the substrate W led by the plurality of guide members 436 of the transport mechanism 430 is the reference position when the substrate supporter WS is provided in the thermal processing unit PHP. However, the invention is not limited to this. When the transport mechanism 430 is not provided in the thermal processing unit PHP, the position of the center of the substrate W led by the plurality of guide members 423 of the heater 420 may be the reference position.

(d) While the substrate W is rotated by 180° by the spin chuck 25 during the teaching operation of FIGS. 20A to 20D in the above-mentioned embodiment, the invention is not limited to this. The substrate W may be rotated by any angle by the spin chuck 25 during the teaching operation of FIGS. 20A to 20D. In this case, the deviations of the reference position coordinates from the tentative target position coordinates can be calculated by a geometric calculation based on the position of the center of the substrate W before the rotation of the substrate W and the position of the center of the substrate W after the rotation of the substrate W.

(14) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiments, the substrate W is an example of a substrate, the substrate processing apparatus 100 is an example of a substrate processing apparatus, and the hands H1, H2 are examples of a first holder, a second holder or a holder. The substrate supporter WS, the casing 113a, the support pin sp, the transport arm 434, the holding pin 624, the spin chuck 25, 35, 98 or the hand H1, H2 is an example of a substrate supporter.

The transport mechanism 115, 127, 128, 137, 138, 141, 142, 146 is an example of a first transport device, a second transport device or a transport device, the sensor device 316 is an example of a position detector and the controller 500 is an example of a controller. A set of the casing 113a and the lid 113b is an example of a guide mechanism, the guide member 436 or the holding pin 624 is an example of the guide mechanism, the carrier 113 is an example of a storage container, and the substrate platform PASS1 to PASS9 is an example of a substrate platform. The suction portion sm is an example of a holding detector or a suction portion, the cooling unit CP, the thermal processing unit PHP, the adhesion reinforcement processing unit PAHP, the placement cooling platform P-CP or the cleaning drying processing unit SD1, SD2 is an example of a processing unit.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing for various substrates.

I claim:

1. A substrate processing apparatus that performs processing on a substrate, comprising:
    a substrate supporter that has a preset reference position and is configured to support the substrate;
    a first transport device that has a first holder configured to hold and transport the substrate by moving the first holder towards the substrate supporter;
    a position detector that detects a positional relationship between the substrate held by the first holder and the first holder; and
    a controller, wherein
    the first holder has three or more suction portions, and a central position of a circle passing through the three or more suction portions is determined as a normal position,
    the controller controls the first transport device to move the first holder such that the normal position coincides with a target position in the substrate supporter and the first holder receives the substrate supported at the reference position in the substrate supporter during a teaching operation regarding the first transport device,
    the controller acquires a deviation between the target position and the reference position as correction information based on the positional relationship detected by the position detector during the teaching operation regarding the first transport device,
    the controller corrects the target position based on the acquired correction information such that the target position coincides with the reference position during the teaching operation or during substrate processing, and
    the controller controls the first transport device such that the first holder is moved to the corrected target position during the substrate processing.

2. The substrate processing apparatus according to claim 1, wherein
    the substrate supporter includes a guide mechanism that leads the substrate to the reference position, and
    the substrate is led to the reference position in the substrate supporter by the guide mechanism during the teaching operation.

3. The substrate processing apparatus according to claim 2, further comprising a storage container that stores the substrate, wherein
    the storing container includes the substrate supporter and is configured to store the substrate at the reference position by the guide mechanism,
    the target position is set in the storing container, and
    the controller controls the first transport device to move the first holder to the target position in the storing container for receiving the substrate stored at the reference position in the storing container during the teaching operation.

4. The substrate processing apparatus according to claim 2, further comprising a processing unit that performs processing on the substrate, wherein
    the processing unit includes the substrate supporter,
    the target position is set in the processing unit, and
    the controller controls the first transport device to move the first holder to the target position in the processing unit and receive the substrate supported at the reference position by the guide mechanism in the processing unit during the teaching operation.

5. The substrate processing apparatus according to claim 1, further comprising a second transport device that has a second holder configured to hold the substrate, the substrate supporter being the second holder, the second transport device transporting the substrate by moving the second holder, wherein
    the target position is set in the second holder when the substrate is received in the first transport device and the substrate is transferred between the first transport device and the second transport device, the controller considers a position of the substrate held by the second holder as the reference position, and controls the first transport device to move the first holder transporting the substrate to the target position in the second holder and receive the substrate from the second holder during the teaching operation.

6. The substrate processing apparatus according to claim 1, further comprising a holding detector for detecting that the first holder is holding a lower surface of the substrate, wherein the controller controls the first transport device to lift the first holder from below the substrate supported at a reference height by the substrate supporter during the teaching operation, the controller determines a target height in a vertical direction based on a position of the first holder in the vertical direction at a detection time point by the holding detector during the teaching operation, and the controller controls the first transport device to move the first holder to the determined target height when the first holder is moved to the substrate supporter during the substrate processing.

7. A substrate processing apparatus that performs processing on a substrate, comprising:

a substrate supporter that has a preset reference position and is configured to hold the substrate in a horizontal attitude and be rotatable about the reference position;

a first transport device that has a first holder configured to hold the substrate and transports the substrate by moving the first holder;

a position detector that detects a positional relationship between the substrate held by the first holder and the first holder; and a controller, wherein the controller controls the first transport device to move the first holder to a target position in the substrate supporter and transfer the substrate to the substrate supporter during a teaching operation regarding the first transport device, the controller controls the substrate supporter such that the substrate supported by the substrate supporter is rotated by a predetermined angle during the teaching operation regarding the first transport device, the controller controls the first transport device to move the first holder to the target position in the substrate supporter and to receive the substrate supported by the substrate supporter during the teaching operation regarding the first transport device, the controller acquires a positional relationship between the first holder and the substrate before the substrate is transferred to the substrate supporter as a first positional relationship during the teaching operation regarding the first transport device, the controller acquires a positional relationship between the first holder and the substrate after the substrate is received from the substrate supporter as a second positional relationship during the teaching operation regarding the first transport device, the controller acquires a deviation between the target position and the reference position as correction information based on the first and second positional relationships during the teaching operation regarding the first transport device, the controller corrects the target position to coincide with the reference position based on the acquired correction information during the teaching operation or during substrate processing, and the controller controls the first transport device to move the first holder to the corrected target position during the substrate processing.

8. The substrate processing apparatus according to claim 7, wherein the predetermined angle is 180 degrees.

9. A substrate processing apparatus that performs processing on a substrate, comprising:

a substrate supporter that has a preset reference position and is configured to support the substrate;

a first transport device that has a first holder configured to hold and transport the substrate by moving the first holder towards the substrate supporter;

a position detector that detects a positional relationship between the substrate held by the first holder and the first holder; and a controller, and further comprising a substrate platform on which the substrate is temporarily placed, the substrate platform being included on the substrate supporter; and a second transport device that has a second holder configured to hold the substrate, the second transport device transporting the substrate by moving the second holder, wherein a target position is set on the substrate platform, and the controller controls the second transport device to move the second holder to the substrate supporter of the substrate platform to place the substrate on the substrate supporter, considers a position of the substrate placed on the substrate supporter as the reference position, and controls the first transport device to move the first holder to the target position on the substrate platform to receive the substrate placed on the substrate supporter during the teaching operation, the controller acquires a deviation between the target position and the reference position as correction information based on the positional relationship detected by the position detector during the teaching operation regarding the first transport device, the controller corrects the target position based on the acquired correction information such that the target position coincides with the reference position during the teaching operation or during substrate processing, and the controller controls the first transport device to move the first holder to the corrected target position during the substrate processing.

10. A substrate processing apparatus that performs processing on a substrate, comprising:

a substrate supporter that has a preset reference position and is configured to be capable of supporting the substrate;

a first transport device that has a first holder configured to hold and transport the substrate by moving the first holder towards the substrate supporter;

a position detector that detects a positional relationship between the substrate held by the first holder and the first holder; and a controller, wherein the first transport device has a plurality of first holders, and the controller controls the first transport device to transfer the substrate to the substrate supporter by moving one first holder towards the substrate supporter during a teaching operation, the controller considers a position of the substrate placed on the substrate supporter, and controls the first transport device to receive the substrate from the substrate supporter by moving another first holder towards the substrate supporter during the teaching operation, the controller acquires a positional relationship between the one first holder and the substrate as a first positional relationship during the teaching operation, the controller acquires a positional relationship between the other first holder and the substrate as a second positional relationship during the teaching operation, the controller acquires a deviation between a target position corresponding to the other first holder and the reference position as correction information corresponding to the other first holder based on the first positional relationship, the second positional relationship, and correction information corresponding to the one first holder during the teaching operation, the controller corrects the target position corresponding to the other first holder based on the acquired correction information corresponding to the other first holder such that the target position corresponding to the other first holder coincides with the reference position during the teaching operation or during the substrate processing, and the controller controls the first transport device to move the other first holder to the corrected target position corresponding to the other first holder during the substrate processing.

11. A substrate processing apparatus that performs processing on a substrate, comprising:

a substrate supporter configured to support the substrate;

a transport device that has a holder configured to hold and transport the substrate by moving the holder towards the substrate supporter;

a holding detector detecting that the holder has held a lower surface of the substrate; and a controller, wherein the holder includes a plurality of suction portions that suck the lower surface of the substrate, the holding detector determines that the holder has held the lower surface of the substrate when all of the plurality of suction portions suck the substrate, and determines that the holder has not held the lower surface of the substrate when any of the plurality of suction portions does not suck the substrate, the controller controls the transport device to lift the holder from below the substrate supported by the substrate supporter at a reference height during a teaching operation regarding the transport device, the controller determines a target height in a vertical direction based on a position of the holder in the vertical direction at a detection time point by the holding detector during the teaching operation regarding the transport device, and the controller controls the transport device to move the holder to the determined target height when the holder is moved to the substrate supporter during substrate processing.

* * * * *